United States Patent
Ku et al.

(10) Patent No.: US 8,724,483 B2
(45) Date of Patent: May 13, 2014

(54) LOOPBACK CONFIGURATION FOR BI-DIRECTIONAL INTERFACES

(75) Inventors: Ting Sheng Ku, San Jose, CA (US); Russell Newcomb, Morgan Hill, CA (US); Barry A. Wagner, San Jose, CA (US); Ashfaq R. Shaikh, San Jose, CA (US); William B. Simms, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 183 days.

(21) Appl. No.: 11/977,092

(22) Filed: Oct. 22, 2007

(65) Prior Publication Data

US 2009/0103443 A1    Apr. 23, 2009

(51) Int. Cl.
*G06F 11/00* (2006.01)

(52) U.S. Cl.
USPC ............................. 370/249; 710/31; 710/38

(58) Field of Classification Search
None
See application file for complete search history.

(56) References Cited

U.S. PATENT DOCUMENTS

| | | |
|---|---|---|
| 3,940,740 A | 2/1976 | Coontz |
| 4,208,810 A | 6/1980 | Rohner et al. |
| 4,412,281 A | 10/1983 | Works |
| 4,541,075 A | 9/1985 | Dill et al. |
| 4,773,044 A | 9/1988 | Sfarti et al. |
| 4,885,703 A | 12/1989 | Deering |
| 4,918,626 A | 4/1990 | Watkins et al. |
| 4,949,280 A | 8/1990 | Littlefield |
| 4,951,220 A | 8/1990 | Ramacher et al. |
| 4,985,988 A | 1/1991 | Littlebury |
| 5,036,473 A | 7/1991 | Butts et al. |
| 5,077,660 A | 12/1991 | Haines et al. |
| 5,081,594 A | 1/1992 | Horsley |
| 5,107,455 A | 4/1992 | Haines et al. |

(Continued)

FOREIGN PATENT DOCUMENTS

| | | |
|---|---|---|
| CN | 101093578 A | 12/2007 |
| JP | 61020348 A2 | 1/1986 |

(Continued)

OTHER PUBLICATIONS

"Addressing the System-on-a-Chip Interconnect Woes Through Communication-Based Design" by Sgroi et al., DAC 2001, Jun. 18-22, 2001, copyright ACM.

(Continued)

*Primary Examiner* — Alex Skripnikov

(57) ABSTRACT

An interface for implementing a loopback configuration which offers improved calibration and/or testing of an electronic system is disclosed. More specifically, embodiments provide a bi-directional interface with at least two portions or partitions capable of communicating data in opposite directions and implementing a loopback configuration between components of an electronic system, thereby enabling more flexible, efficient and effective calibration and/or testing of the electronic system using a single interface. The loopback of the partitioned bi-directional interface may be used to perform data link training and/or electronic system testing. In one embodiment, the loopback configuration of the interface may be reversible. Additionally, the looped or coupled end of the partitions may be switched from one component to another, thereby reversing the configuration of the loopback in one embodiment. As such, embodiments enable different and/or additional calibration operations and/or tests to be performed when compared with conventional loopback configurations.

18 Claims, 11 Drawing Sheets

(56) References Cited

U.S. PATENT DOCUMENTS

| | | | |
|---|---|---|---|
| 5,125,011 A * | 6/1992 | Fung | 377/73 |
| 5,276,893 A | 1/1994 | Savaria | |
| 5,287,438 A | 2/1994 | Kelleher | |
| 5,313,287 A | 5/1994 | Barton | |
| 5,379,405 A | 1/1995 | Ostrowski | |
| 5,392,437 A | 2/1995 | Matter et al. | |
| 5,400,777 A | 3/1995 | Olsson et al. | |
| 5,408,606 A | 4/1995 | Eckart | |
| 5,432,898 A | 7/1995 | Curb et al. | |
| 5,446,836 A | 8/1995 | Lentz et al. | |
| 5,448,496 A | 9/1995 | Butts et al. | |
| 5,452,104 A | 9/1995 | Lee | |
| 5,452,412 A | 9/1995 | Johnson, Jr. et al. | |
| 5,455,536 A | 10/1995 | Kono et al. | |
| 5,483,258 A | 1/1996 | Cornett et al. | |
| 5,498,975 A | 3/1996 | Cliff et al. | |
| 5,513,144 A | 4/1996 | O'Toole | |
| 5,513,354 A | 4/1996 | Dwork et al. | |
| 5,517,666 A | 5/1996 | Ohtani et al. | |
| 5,530,457 A | 6/1996 | Helgeson | |
| 5,543,935 A | 8/1996 | Harrington | |
| 5,570,463 A | 10/1996 | Dao | |
| 5,574,847 A | 11/1996 | Eckart et al. | |
| 5,578,976 A | 11/1996 | Yao | |
| 5,594,854 A | 1/1997 | Baldwin et al. | |
| 5,623,692 A | 4/1997 | Priem et al. | |
| 5,630,171 A | 5/1997 | Chejlava, Jr. et al. | |
| 5,633,297 A | 5/1997 | Valko et al. | |
| 5,634,107 A | 5/1997 | Yumoto et al. | |
| 5,638,946 A | 6/1997 | Zavracky | |
| 5,664,162 A | 9/1997 | Dye | |
| 5,671,376 A | 9/1997 | Bucher et al. | |
| 5,694,143 A | 12/1997 | Fielder et al. | |
| 5,705,938 A | 1/1998 | Kean | |
| 5,766,979 A | 6/1998 | Budnaitis | |
| 5,768,178 A | 6/1998 | McLaury | |
| 5,778,348 A | 7/1998 | Manduley et al. | |
| 5,805,833 A | 9/1998 | Verdun | |
| 5,809,230 A | 9/1998 | Pereira | |
| 5,815,162 A | 9/1998 | Levine | |
| 5,821,949 A | 10/1998 | Deering | |
| 5,854,631 A | 12/1998 | Akeley et al. | |
| 5,854,637 A | 12/1998 | Sturges | |
| 5,872,902 A | 2/1999 | Kuchkuda et al. | |
| 5,884,053 A | 3/1999 | Clouser et al. | |
| 5,896,391 A | 4/1999 | Solheim et al. | |
| 5,909,595 A | 6/1999 | Rosenthal et al. | |
| 5,913,218 A | 6/1999 | Carney et al. | |
| 5,937,173 A | 8/1999 | Olarig et al. | |
| 5,956,252 A | 9/1999 | Lau et al. | |
| 5,956,505 A | 9/1999 | Manduley | |
| 5,968,175 A | 10/1999 | Morishita et al. | |
| 5,977,987 A | 11/1999 | Duluk, Jr. | |
| 5,996,996 A | 12/1999 | Brunelle | |
| 5,999,990 A | 12/1999 | Sharrit et al. | |
| 6,003,100 A | 12/1999 | Lee | |
| 6,028,608 A | 2/2000 | Jenkins | |
| 6,034,699 A | 3/2000 | Wong et al. | |
| 6,038,348 A | 3/2000 | Carley | |
| 6,049,870 A | 4/2000 | Greaves | |
| 6,065,131 A | 5/2000 | Andrews et al. | |
| 6,067,262 A | 5/2000 | Irrinki et al. | |
| 6,067,633 A | 5/2000 | Robbins et al. | |
| 6,069,540 A | 5/2000 | Berenz et al. | |
| 6,072,500 A | 6/2000 | Foran et al. | |
| 6,072,686 A | 6/2000 | Yarbrough | |
| 6,085,269 A | 7/2000 | Chan et al. | |
| 6,094,116 A | 7/2000 | Tai et al. | |
| 6,098,118 A | 8/2000 | Ellenby et al. | |
| 6,104,407 A | 8/2000 | Aleksic et al. | |
| 6,104,417 A | 8/2000 | Nielsen et al. | |
| 6,115,049 A | 9/2000 | Winner et al. | |
| 6,118,394 A | 9/2000 | Onaya | |
| 6,128,000 A | 10/2000 | Jouppi et al. | |
| 6,129,070 A | 10/2000 | Jingu et al. | |
| 6,137,918 A | 10/2000 | Harrington et al. | |
| 6,160,557 A | 12/2000 | Narayanaswami | |
| 6,160,559 A | 12/2000 | Omtzigt | |
| 6,188,394 B1 | 2/2001 | Morein et al. | |
| 6,201,545 B1 | 3/2001 | Wong et al. | |
| 6,204,859 B1 | 3/2001 | Jouppi et al. | |
| 6,219,070 B1 | 4/2001 | Baker et al. | |
| 6,219,628 B1 | 4/2001 | Kodosky et al. | |
| 6,249,288 B1 | 6/2001 | Campbell | |
| 6,249,853 B1 | 6/2001 | Porterfield | |
| 6,255,849 B1 | 7/2001 | Mohan | |
| 6,256,758 B1 | 7/2001 | Abramovici et al. | |
| 6,259,460 B1 | 7/2001 | Gossett et al. | |
| 6,307,169 B1 | 10/2001 | Sun et al. | |
| 6,323,699 B1 | 11/2001 | Quiet | |
| 6,323,874 B1 | 11/2001 | Gossett | |
| 6,348,811 B1 * | 2/2002 | Haycock et al. | 326/16 |
| 6,359,623 B1 | 3/2002 | Larson | |
| 6,362,819 B1 | 3/2002 | Dalal et al. | |
| 6,363,285 B1 | 3/2002 | Wey | |
| 6,363,295 B1 | 3/2002 | Akram et al. | |
| 6,366,289 B1 | 4/2002 | Johns | |
| 6,370,603 B1 | 4/2002 | Silverman et al. | |
| 6,377,898 B1 | 4/2002 | Steffan et al. | |
| 6,388,590 B1 | 5/2002 | Ng | |
| 6,389,585 B1 | 5/2002 | Masleid et al. | |
| 6,392,431 B1 | 5/2002 | Jones | |
| 6,429,288 B1 | 8/2002 | Esswein et al. | |
| 6,429,747 B2 | 8/2002 | Franck et al. | |
| 6,429,877 B1 | 8/2002 | Stroyan | |
| 6,433,657 B1 | 8/2002 | Chen | |
| 6,437,657 B1 | 8/2002 | Jones | |
| 6,437,780 B1 | 8/2002 | Baltaretu et al. | |
| 6,452,595 B1 | 9/2002 | Montrym et al. | |
| 6,469,707 B1 | 10/2002 | Voorhies | |
| 6,480,205 B1 | 11/2002 | Greene et al. | |
| 6,486,425 B2 | 11/2002 | Seki | |
| 6,501,564 B1 | 12/2002 | Schramm et al. | |
| 6,504,542 B1 | 1/2003 | Voorhies et al. | |
| 6,504,841 B1 | 1/2003 | Larson et al. | |
| 6,522,329 B1 | 2/2003 | Ihara et al. | |
| 6,525,737 B1 | 2/2003 | Duluk, Jr. et al. | |
| 6,529,207 B1 | 3/2003 | Landau et al. | |
| 6,530,045 B1 | 3/2003 | Cooper et al. | |
| 6,530,049 B1 | 3/2003 | Abramovici et al. | |
| 6,535,986 B1 | 3/2003 | Rosno et al. | |
| 6,550,030 B1 | 4/2003 | Abramovici et al. | |
| 6,598,194 B1 | 7/2003 | Madge et al. | |
| 6,606,093 B1 | 8/2003 | Gossett et al. | |
| 6,611,272 B1 | 8/2003 | Hussain et al. | |
| 6,614,444 B1 | 9/2003 | Duluk, Jr. et al. | |
| 6,614,448 B1 | 9/2003 | Garlick et al. | |
| 6,624,823 B2 | 9/2003 | Deering | |
| 6,629,181 B1 | 9/2003 | Alappat et al. | |
| 6,633,197 B1 | 10/2003 | Sutardja | |
| 6,633,297 B2 | 10/2003 | McCormack et al. | |
| 6,646,639 B1 | 11/2003 | Greene et al. | |
| 6,662,133 B2 | 12/2003 | Engel et al. | |
| 6,671,000 B1 | 12/2003 | Cloutier | |
| 6,693,637 B2 | 2/2004 | Koneru et al. | |
| 6,693,639 B2 | 2/2004 | Duluk, Jr. et al. | |
| 6,697,063 B1 | 2/2004 | Zhu | |
| 6,700,581 B2 | 3/2004 | Baldwin et al. | |
| 6,701,466 B1 | 3/2004 | Fiedler | |
| 6,717,474 B2 | 4/2004 | Chen et al. | |
| 6,717,576 B1 | 4/2004 | Duluk, Jr. et al. | |
| 6,717,578 B1 | 4/2004 | Deering | |
| 6,718,496 B1 | 4/2004 | Fukuhisa et al. | |
| 6,734,770 B2 | 5/2004 | Aigner et al. | |
| 6,734,861 B1 | 5/2004 | Van Dyke et al. | |
| 6,738,856 B1 | 5/2004 | Milley et al. | |
| 6,741,247 B1 | 5/2004 | Fenney | |
| 6,741,258 B1 | 5/2004 | Peck, Jr. et al. | |
| 6,742,000 B1 | 5/2004 | Fantasia et al. | |
| 6,747,057 B2 | 6/2004 | Ruzafa et al. | |
| 6,747,483 B2 | 6/2004 | To et al. | |
| 6,765,575 B1 | 7/2004 | Voorhies et al. | |
| 6,778,177 B1 | 8/2004 | Furtner | |
| 6,782,587 B2 | 8/2004 | Reilly | |

(56) References Cited

U.S. PATENT DOCUMENTS

| | | |
|---|---|---|
| 6,785,841 B2 | 8/2004 | Akrout et al. |
| 6,788,101 B1 | 9/2004 | Rahman |
| 6,788,301 B2 | 9/2004 | Thrasher |
| 6,794,101 B2 | 9/2004 | Liu et al. |
| 6,798,410 B1 | 9/2004 | Redshaw et al. |
| 6,803,782 B2 | 10/2004 | Koob et al. |
| 6,803,916 B2 | 10/2004 | Ramani et al. |
| 6,806,788 B1 | 10/2004 | Marumoto |
| 6,819,332 B2 | 11/2004 | Baldwin |
| 6,823,283 B2 | 11/2004 | Steger et al. |
| 6,825,847 B1 | 11/2004 | Molnar et al. |
| 6,833,835 B1 | 12/2004 | van Vugt |
| 6,849,924 B2 | 2/2005 | Allison et al. |
| 6,850,133 B2 | 2/2005 | Ma |
| 6,861,865 B1 | 3/2005 | Carlson |
| 6,862,027 B2 | 3/2005 | Andrews et al. |
| 6,879,207 B1 | 4/2005 | Nickolls |
| 6,906,716 B2 | 6/2005 | Moreton et al. |
| 6,938,176 B1 | 8/2005 | Alben et al. |
| 6,940,514 B1 | 9/2005 | Wasserman et al. |
| 6,947,057 B2 | 9/2005 | Nelson et al. |
| 6,956,579 B1 | 10/2005 | Diard et al. |
| 6,961,057 B1 | 11/2005 | Van Dyke et al. |
| 6,966,020 B1 | 11/2005 | Abramovici et al. |
| 6,973,608 B1 | 12/2005 | Abramovici et al. |
| 6,978,317 B2 | 12/2005 | Anantha et al. |
| 6,982,718 B2 | 1/2006 | Kilgard et al. |
| 7,002,591 B1 | 2/2006 | Leather et al. |
| 7,009,607 B2 | 3/2006 | Lindholm et al. |
| 7,009,615 B1 | 3/2006 | Kilgard et al. |
| 7,020,598 B1 | 3/2006 | Jacobson |
| 7,043,622 B2 | 5/2006 | Henry et al. |
| 7,058,738 B2 | 6/2006 | Stufflebeam, Jr. |
| 7,061,495 B1 | 6/2006 | Leather |
| 7,064,771 B1 | 6/2006 | Jouppi et al. |
| 7,069,369 B2 | 6/2006 | Chou et al. |
| 7,069,458 B1 | 6/2006 | Sardi et al. |
| 7,069,558 B1 | 6/2006 | Stone et al. |
| 7,075,542 B1 | 7/2006 | Leather |
| 7,075,797 B1 | 7/2006 | Leonard et al. |
| 7,081,902 B1 | 7/2006 | Crow et al. |
| 7,085,824 B2 | 8/2006 | Forth et al. |
| 7,119,809 B1 | 10/2006 | McCabe |
| 7,124,318 B2 | 10/2006 | Luick |
| 7,126,600 B1 | 10/2006 | Fowler et al. |
| 7,136,953 B1 * | 11/2006 | Bisson et al. .......... 710/307 |
| 7,154,066 B2 | 12/2006 | Talwar et al. |
| 7,158,148 B2 | 1/2007 | Toji et al. |
| 7,170,315 B2 | 1/2007 | Bakker et al. |
| 7,170,515 B1 | 1/2007 | Zhu |
| 7,174,407 B2 | 2/2007 | Hou et al. |
| 7,174,411 B1 | 2/2007 | Ngai |
| 7,184,040 B1 | 2/2007 | Tzvetkov |
| 7,185,135 B1 | 2/2007 | Briggs et al. |
| 7,185,225 B2 | 2/2007 | Sutardja et al. |
| 7,187,383 B2 | 3/2007 | Kent |
| 7,224,364 B1 | 5/2007 | Yue et al. |
| 7,246,274 B2 | 7/2007 | Kizer et al. |
| 7,260,007 B2 | 8/2007 | Jain et al. |
| RE39,898 E | 10/2007 | Nally et al. |
| 7,293,127 B2 | 11/2007 | Caruk |
| 7,305,571 B2 | 12/2007 | Cranford, Jr. et al. |
| 7,307,628 B1 | 12/2007 | Goodman et al. |
| 7,307,638 B2 | 12/2007 | Leather et al. |
| 7,324,458 B2 * | 1/2008 | Schoenborn et al. ......... 370/249 |
| 7,340,541 B2 * | 3/2008 | Castro et al. .................... 710/31 |
| 7,362,325 B2 | 4/2008 | Anderson |
| 7,373,547 B2 | 5/2008 | Sutardja et al. |
| 7,382,368 B1 | 6/2008 | Molnar et al. |
| 7,398,336 B2 | 7/2008 | Feng et al. |
| 7,414,636 B2 | 8/2008 | Kokojima et al. |
| 7,415,551 B2 | 8/2008 | Pescatore |
| 7,424,564 B2 | 9/2008 | Mehta et al. |
| 7,437,021 B2 | 10/2008 | Satoh |
| 7,453,466 B2 | 11/2008 | Hux et al. |
| 7,480,808 B2 | 1/2009 | Caruk et al. |
| 7,483,029 B2 | 1/2009 | Crow et al. |
| 7,525,986 B2 | 4/2009 | Lee et al. |
| 7,548,996 B2 | 6/2009 | Baker et al. |
| 7,551,174 B2 | 6/2009 | Iourcha et al. |
| 7,594,061 B2 | 9/2009 | Shen et al. |
| 7,633,506 B1 | 12/2009 | Leather et al. |
| 7,634,637 B1 | 12/2009 | Lindholm et al. |
| 7,663,633 B1 | 2/2010 | Diamond et al. |
| 7,782,325 B2 | 8/2010 | Gonzalez et al. |
| 7,791,617 B2 | 9/2010 | Crow et al. |
| 7,793,029 B1 | 9/2010 | Parson et al. |
| 7,965,902 B1 | 6/2011 | Zelinka et al. |
| 8,063,903 B2 | 11/2011 | Vignon et al. |
| 8,132,015 B1 | 3/2012 | Wyatt |
| 8,144,166 B2 | 3/2012 | Lyapunov et al. |
| 8,237,738 B1 | 8/2012 | Crow |
| 8,412,872 B1 | 4/2013 | Wagner et al. |
| 8,417,838 B2 | 4/2013 | Tamasi et al. |
| 2001/0005209 A1 | 6/2001 | Lindholm et al. |
| 2002/0005729 A1 | 1/2002 | Leedy |
| 2002/0026623 A1 | 2/2002 | Morooka |
| 2002/0031025 A1 | 3/2002 | Shimano et al. |
| 2002/0050979 A1 | 5/2002 | Oberoi et al. |
| 2002/0059392 A1 | 5/2002 | Ellis, III |
| 2002/0087833 A1 | 7/2002 | Burns et al. |
| 2002/0091979 A1 | 7/2002 | Cooke et al. |
| 2002/0097241 A1 | 7/2002 | McCormack et al. |
| 2002/0120723 A1 | 8/2002 | Forth et al. |
| 2002/0130863 A1 | 9/2002 | Baldwin |
| 2002/0138750 A1 | 9/2002 | Gibbs et al. |
| 2002/0140655 A1 | 10/2002 | Liang et al. |
| 2002/0143653 A1 | 10/2002 | DiLena et al. |
| 2002/0158869 A1 | 10/2002 | Ohba et al. |
| 2002/0158885 A1 | 10/2002 | Brokenshire et al. |
| 2002/0196251 A1 | 12/2002 | Duluk, Jr. et al. |
| 2002/0199110 A1 | 12/2002 | Kean |
| 2003/0020173 A1 | 1/2003 | Huff et al. |
| 2003/0023771 A1 | 1/2003 | Erickson et al. |
| 2003/0046472 A1 | 3/2003 | Morrow |
| 2003/0051091 A1 | 3/2003 | Leung et al. |
| 2003/0061409 A1 | 3/2003 | RuDusky |
| 2003/0067468 A1 | 4/2003 | Duluk, Jr. et al. |
| 2003/0076325 A1 | 4/2003 | Thrasher |
| 2003/0093506 A1 | 5/2003 | Oliver et al. |
| 2003/0101288 A1 | 5/2003 | Tague et al. |
| 2003/0115500 A1 | 6/2003 | Akrout et al. |
| 2003/0122815 A1 | 7/2003 | Deering |
| 2003/0160795 A1 | 8/2003 | Alcorn et al. |
| 2003/0163589 A1 | 8/2003 | Bunce et al. |
| 2003/0164830 A1 | 9/2003 | Kent |
| 2003/0179631 A1 | 9/2003 | Koob et al. |
| 2003/0194116 A1 | 10/2003 | Wong et al. |
| 2003/0201994 A1 | 10/2003 | Taylor et al. |
| 2004/0012082 A1 | 1/2004 | Dewey et al. |
| 2004/0012597 A1 | 1/2004 | Zatz et al. |
| 2004/0046764 A1 | 3/2004 | Lefebvre et al. |
| 2004/0064628 A1 | 4/2004 | Chiu |
| 2004/0085313 A1 | 5/2004 | Moreton et al. |
| 2004/0102187 A1 | 5/2004 | Moller et al. |
| 2004/0130552 A1 | 7/2004 | Duluk, Jr. et al. |
| 2004/0183148 A1 | 9/2004 | Blasko, III |
| 2004/0183801 A1 | 9/2004 | Deering |
| 2004/0188781 A1 | 9/2004 | Bar |
| 2004/0196285 A1 | 10/2004 | Rice et al. |
| 2004/0196290 A1 | 10/2004 | Satoh |
| 2004/0207642 A1 | 10/2004 | Crisu et al. |
| 2004/0225787 A1 | 11/2004 | Ma et al. |
| 2004/0227599 A1 | 11/2004 | Shen et al. |
| 2004/0246251 A1 | 12/2004 | Fenney et al. |
| 2005/0030314 A1 | 2/2005 | Dawson |
| 2005/0041031 A1 | 2/2005 | Diard |
| 2005/0041037 A1 | 2/2005 | Dawson |
| 2005/0044284 A1 | 2/2005 | Pescatore |
| 2005/0045722 A1 | 3/2005 | Park |
| 2005/0060601 A1 | 3/2005 | Gomm |
| 2005/0066148 A1 | 3/2005 | Luick |
| 2005/0088445 A1 | 4/2005 | Gonzalez et al. |
| 2005/0122338 A1 | 6/2005 | Hong et al. |

(56) References Cited

U.S. PATENT DOCUMENTS

| | | |
|---|---|---|
| 2005/0125629 A1 | 6/2005 | Kissell |
| 2005/0134588 A1 | 6/2005 | Aila et al. |
| 2005/0134603 A1 | 6/2005 | Iourcha et al. |
| 2005/0172135 A1 | 8/2005 | Wiersma |
| 2005/0173233 A1 | 8/2005 | Kaelberer |
| 2005/0174353 A1 | 8/2005 | Alcorn et al. |
| 2005/0179698 A1 | 8/2005 | Vijayakumar et al. |
| 2005/0182881 A1 | 8/2005 | Chou et al. |
| 2005/0210472 A1 | 9/2005 | Accapadi et al. |
| 2005/0237083 A1 | 10/2005 | Bakker et al. |
| 2005/0246460 A1 | 11/2005 | Stufflebeam, Jr. |
| 2005/0251358 A1 | 11/2005 | Van Dyke et al. |
| 2005/0251761 A1 | 11/2005 | Diamond et al. |
| 2005/0259100 A1 | 11/2005 | Teruyama |
| 2005/0261863 A1 | 11/2005 | Van Dyke et al. |
| 2005/0275663 A1 | 12/2005 | Kokojima et al. |
| 2005/0278666 A1 | 12/2005 | Diamond |
| 2005/0285863 A1 | 12/2005 | Diamond |
| 2006/0004536 A1 | 1/2006 | Diamond et al. |
| 2006/0033745 A1 | 2/2006 | Koselj et al. |
| 2006/0044317 A1 | 3/2006 | Bourd et al. |
| 2006/0053188 A1 | 3/2006 | Mantor et al. |
| 2006/0053189 A1 | 3/2006 | Mantor |
| 2006/0055641 A1 | 3/2006 | Robertus et al. |
| 2006/0106911 A1 | 5/2006 | Chapple et al. |
| 2006/0123177 A1 | 6/2006 | Chan et al. |
| 2006/0132495 A1 | 6/2006 | Anderson |
| 2006/0170690 A1 | 8/2006 | Leather |
| 2006/0190663 A1 | 8/2006 | Lu |
| 2006/0203005 A1 | 9/2006 | Hunter |
| 2006/0221086 A1 | 10/2006 | Diard |
| 2006/0245001 A1 | 11/2006 | Lee et al. |
| 2006/0252285 A1 | 11/2006 | Shen |
| 2006/0267981 A1 | 11/2006 | Naoi |
| 2006/0267987 A1 | 11/2006 | Litchmanov |
| 2006/0282604 A1 | 12/2006 | Temkine et al. |
| 2007/0038794 A1 | 2/2007 | Purcell et al. |
| 2007/0067535 A1 | 3/2007 | Liu |
| 2007/0088877 A1 | 4/2007 | Chen et al. |
| 2007/0115271 A1 | 5/2007 | Seo et al. |
| 2007/0115290 A1 | 5/2007 | Polzin et al. |
| 2007/0115291 A1 | 5/2007 | Chen et al. |
| 2007/0139440 A1 | 6/2007 | Crow et al. |
| 2007/0268298 A1 | 11/2007 | Alben et al. |
| 2007/0273689 A1 | 11/2007 | Tsao |
| 2007/0296725 A1 | 12/2007 | Steiner et al. |
| 2008/0024497 A1 | 1/2008 | Crow et al. |
| 2008/0024522 A1 | 1/2008 | Crow et al. |
| 2008/0100618 A1 | 5/2008 | Woo et al. |
| 2008/0198163 A1 | 8/2008 | Nakahashi et al. |
| 2008/0273218 A1 | 11/2008 | Kitora et al. |
| 2009/0044003 A1 | 2/2009 | Berthiaume et al. |

FOREIGN PATENT DOCUMENTS

| | | |
|---|---|---|
| JP | 04266768 | 9/1992 |
| JP | 06180758 | 6/1994 |
| JP | 10134198 | 5/1998 |
| JP | 11195132 | 7/1999 |
| JP | 11328133 A2 | 11/1999 |
| JP | 2002076120 A2 | 3/2002 |
| JP | 2005182547 | 7/2005 |
| TW | 093127712 | 7/2005 |
| WO | 0013145 | 3/2000 |
| WO | 02/054224 A1 | 7/2002 |
| WO | 2004030127 | 3/2005 |
| WO | 2005029329 | 3/2005 |

OTHER PUBLICATIONS

Welch, D. "Building Self-Reconfiguring Distributed Systems Using Compensating Reconfiguration", Proceedings Fourth International Journal Conference on Configurable Distributed Systems, May 4-6, 1998, pp. 18-25.

International Search Report. PCT/US2004/030127. Mail Date Jun. 30, 2005.

PCT International Preliminary Report on Patentability. PCT/US2004/030127. International Filing Date Sep. 13, 2004. Application: Nvidia Corporation. Date of Issuance of this Report: Mar. 16, 2006.

A parallel algorithm for polygon rasterization Juan Pineda Jun. 1988 ACM XX.

A VLSI architecture for updating raster-scan displays Satish Gupta, Robert F. Sproull, Ivan E. Sutherland Aug. 1981 ACM SIGGRAPH Computer Graphics, Proceedings of the 8th annual conference on Computer graphics and interactive techniques SIGGRAPH '81, vol. 15 Issue 3 Publisher: ACM Press. XX.

Boyer, et al.; "Discrete Analysis for Antialiased Lines," Eurographics 2000; 3 pages. XX.

Crow; "The Use of Grayscale for Improves Raster Display of Vectors and Characters;" University of Texas, Austin, Texas; Work supported by the National Science Foundation unser Grants MCS 76-83889; pp. 1-5: ACM Press. XX, 1978.

"Addressing the System-on-a-Chip Interconnect Woes Through Communication-Based Design" by Sgrol et al., DAC 2001, Jun. 18-22, 2001, copyright ACM.

"OSI Reference Model-The ISO Model of Architecture for Open Systems Interconnection," by Zimmermann, IEEE Transactions on Communicaions, Apr. 1980.

"SuperPaint: An Early Frame Buffer Graphics System", by Richard Shoup, IEEE Annals of the History of Computing, copyright 2001.

"Multimedia Processors" by Kuroda et al., Proceedings of the IEEE, Jun. 1998.

"Test Requirements for Embedded Core-based Systems and IEEE P1500" by Yervant Zorian, International Test Conference,copyright IEEE 1997.

PCI Express Card Electromechanical Specification Rev. 1.1, 2005, p. 87.

A parallel algorithm for polygon rasterization Juan Pineda Jun. 1988 ACM.

A VLSI architecture for updating raster-scan displays Satish Gupta, Robert F. Sproull, Ivan E. Sutherland Aug. 1981 ACM SIGGRAPH Computer Graphics , Proceedings of the 8th annual conference on Computer graphics and interactive techniques SIGGRAPH '81, vol. 15 Issue 3 Publisher: ACM Press.

Blythe, OpenGL Section 3.4.1, "Basic Line Segment Rasterization", Mar. 29, 1997, pp. 1-3.

Boyer, et al.; "Discrete Analysis for Antialiased Lines," Eurographics 2000; 3 Pages.

Crow; "he Use of Grayscale for Improves Raster Display of Vectors and Characters;" University of Texas, Austin, Texas; Work supported by the National Science Foundation unser Grants MCS 76-83889; pp. 1-5: ACM Press, 1978.

* cited by examiner

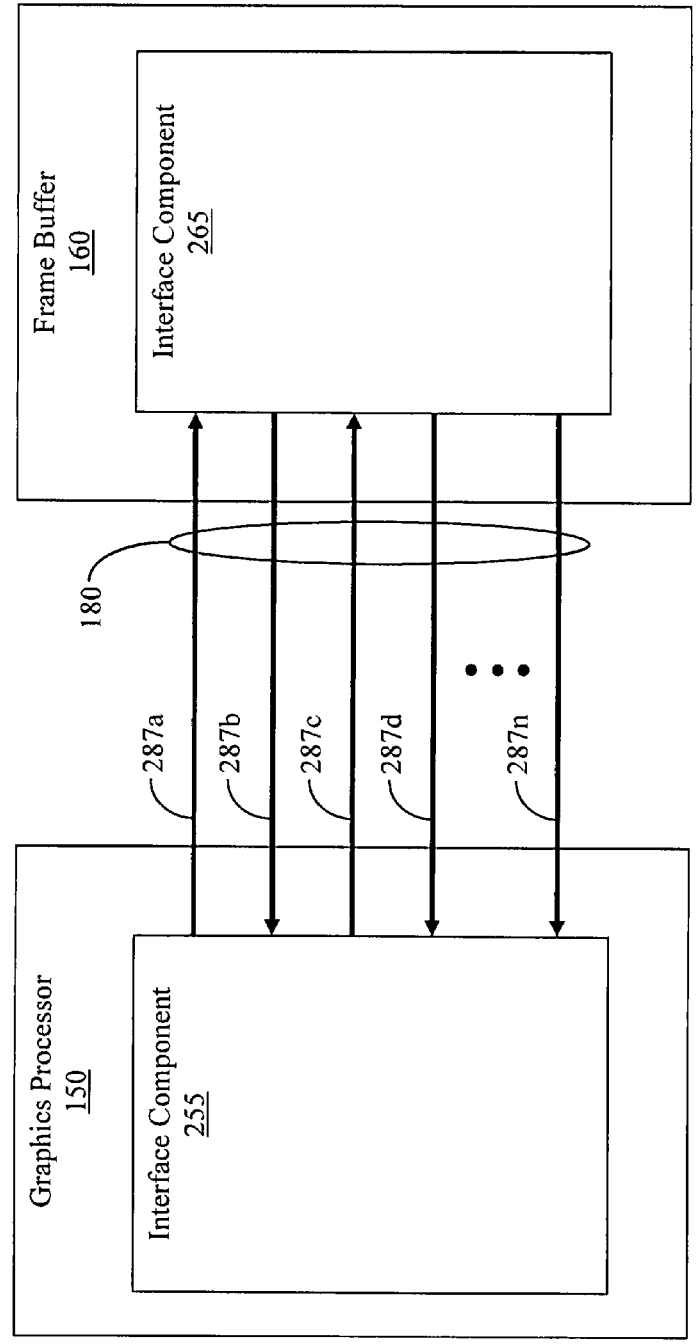

LOOPBACK CONFIGURATION FOR BI-DIRECTIONAL INTERFACES

BACKGROUND OF THE INVENTION

Loopback configurations are often used to calibrate and test integrated circuits. For example, a master component or circuit may send data and/or clock signals to a slave component to calibrate the slave component with respect to the master component (e.g., often referred to as "training"), where the responses received by the master component from the slave component indicate whether or not the slave component is calibrated. Additionally, this training using the loopback configuration can be performed periodically to recalibrate the system and compensate for variations (e.g., process variations, voltage variations, temperature variations, etc.) which occur over time. Loopback configurations may also be used to test or verify a slave component by sending test data (e.g., test vectors or patterns) to the slave component and comparing received responses with expected values to validate the operation of the slave component.

Some conventional loopback configurations utilize multiple dedicated unidirectional interfaces for sending the training data or test data between the master and slave components. For example, a first interface is used to send the data from the master component to the slave component, whereas a second interface is used to send data from the slave component to the master component. As such, each interface has a fixed (e.g., predetermined and unchangeable) direction of data communication.

Although conventional loopback configurations using multiple unidirectional interfaces enable integrated circuit calibration and testing, the results of the testing and the effectiveness of the calibration is limited. For example, the use of multiple interfaces makes it more difficult to isolate problems that may exist on one of the multiple interfaces. Additionally, since multiple interfaces are required to calibrate the system, the interfaces cannot be calibrated separately. As such, additional calibration steps are required to account for all the possible loopback configurations, where each configuration utilizes a different combination of interfaces and/or interface components (e.g., required to link the interfaces and implement the loopback). Further, the fixed master/slave relationship and the fixed direction of data communication between the components further limits the calibration and testing of the system and components thereof.

Other conventional loopback configurations use multiple bi-directional interfaces for communicating data between master and slave components. Conventional bi-directional interfaces comprise multiple paths or lanes, where each lane is capable of communicating information in either a forward or reverse direction depending upon the current configuration of each respective lane. Additionally, conventional bi-directional interfaces configure all lanes to communicate information in the same direction (e.g., all in the forward direction or all in the reverse direction), thereby operating similarly to a dedicated unidirectional interface at any given instant in time. As such, conventional loopback configurations using multiple bi-directional interfaces operate similarly to the conventional loopback configurations utilizing multiple unidirectional interfaces. Thus, conventional loopback configurations using multiple bi-directional interfaces suffer drawbacks similar to those discussed above with respect to conventional loopback configurations utilizing multiple unidirectional interfaces.

SUMMARY OF THE INVENTION

Accordingly, a need exists for a loopback configuration which improves calibration and/or testing capabilities of electronic systems. More specially, a need exists for a loopback configuration which enables more flexible, effective and meaningful calibration and/or testing of electronic systems. Embodiments of the present invention provide novel solutions to these needs and others as described below.

Embodiments are directed to an interface for implementing a loopback configuration which offers improved calibration and/or testing of an electronic system. More specifically, embodiments provide a bi-directional interface (e.g., communication bus) with at least two portions or partitions capable of communicating data in opposite directions and implementing a loopback configuration between components (e.g., a memory controller and a memory, a graphics processor and a memory, between other computer system components, etc.) of an electronic system, thereby enabling more flexible, efficient and effective calibration and/or testing of the electronic system (e.g., comprising the bi-directional interface) using a single interface. The loopback of the partitioned bi-directional interface may be used to perform data link training (e.g., for calibration of a data link, calibration of at least one of the components coupled to the bi-directional interface, compensation for PVT variations of the electronic system, etc.) and/or electronic system testing (e.g., automated testing of components and/or circuitry coupled to the bi-directional interface).

The loopback configuration of the interface may be reversible. For example, the direction in which each partition communicates data may be reversed to effectively reverse the direction of the loopback. Additionally, the looped or coupled end of the partitions may be switched from one component to another, thereby reversing the configuration of the loopback in one embodiment. As such, embodiments enable different and/or additional calibration operations and/or tests to be performed when compared with conventional loopback configurations.

In one embodiment, a bi-directional communication bus includes a first bi-directional portion configured for communicating signals in a first direction, wherein a size of the first bi-directional portion is configurable. The bi-directional communication bus also includes a second bi-directional portion configured for communicating signals in a second direction, wherein the second direction and the first direction are opposed, wherein a size of the second bi-directional portion is configurable. The first and second portions are configured to implement a loopback configuration for communicating signals between components coupled to the first and second portions. The components may include a first component and a second component, and wherein the first and second bi-directional portions communicatively couple the first and second components. In one embodiment, the first component is selected from a group consisting of a graphics processor and a memory controller, wherein the second component includes a memory, and wherein the first and second bi-directional portions implement a memory interface. The loopback configuration of the first and second bi-directional portions may be for performing operations selected from a group consisting of calibration of the bi-directional interface, calibration of at least one of the components, and testing of at least one of the components.

In another embodiment, a method of communicating signals includes partitioning a bi-directional communication bus into a first portion for performing read operations and a second portion for performing write operations. A training operation is performed to characterize signal delay across the communication bus using the first portion and the second portion. At a completion of a training operation, the bi-directional communication bus is reconfigured to communicate signals in a same direction over the first and second portions. Paths of the first portion and paths of the second portion may be interlaced. Additionally, the performing a training operation may include the first portion and the second portion performing read and write operations simultaneously. Alternatively, the performing a training operation may include the first portion and the second portion performing read and write operations sequentially. Further, the first portion may have a larger number of paths than the second portion in one embodiment.

In yet another embodiment, a method of configuring a bi-directional memory interface includes initiating a loopback configuration of a first portion and a second portion of the bi-directional interface, wherein the first and second portions couple a memory to a memory controller. Signals are communicated over the first portion from the memory controller to the memory. Signals are communicated over the second portion from the memory to the memory controller. The loopback configuration is exited and a normal operating mode of the bi-directional interface is commenced, wherein the normal operating mode comprises accessing the memory using the bi-directional interface, wherein the first and second portions of the bi-directional bus communicate signals in a same direction during the normal operating mode. The memory controller may be implemented within a graphics processor in one embodiment. The direction of signal communication over the first and second portions in the loopback configuration may be reversible. Additionally, communication of the signals over the first and second portions may include performing operations selected from a group consisting of calibration of the bi-directional interface, calibration of the memory, and testing of the memory.

BRIEF DESCRIPTION OF THE DRAWINGS

The present invention is illustrated by way of example, and not by way of limitation, in the figures of the accompanying drawings and in which like reference numerals refer to similar elements.

FIG. 2C shows a block diagram of an exemplary partitioning of a bi-directional interface in an interlaced manner for implementing an exemplary loopback configuration in accordance with one embodiment of the present invention.

DETAILED DESCRIPTION OF THE INVENTION

Figure 1:
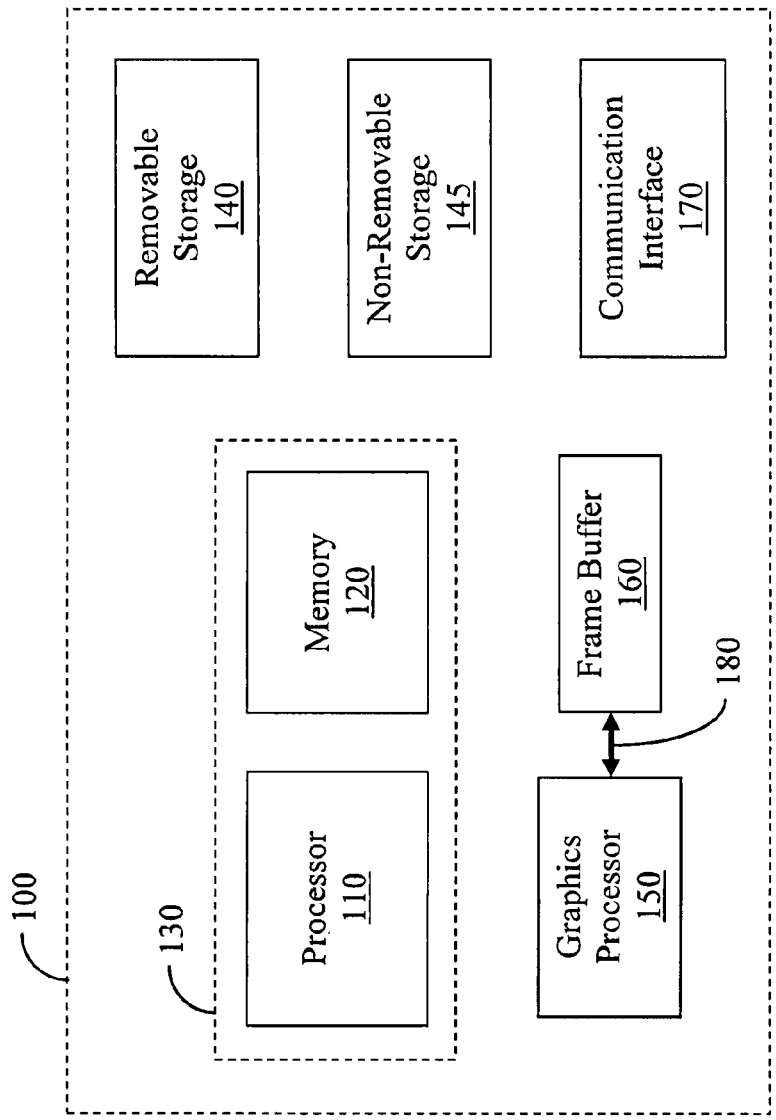
FIG. 1 shows an exemplary computer system platform upon which embodiments of the present invention may be implemented.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "accepting," "accessing," "adding," "adjusting," "analyzing," "applying," "assembling," "assigning," "calculating," "capturing," "combining," "commencing," "communicating," "comparing," "collecting," "creating," "defining," "depicting," "detecting," "determining," "displaying," "establishing," "executing," "exiting," "generating," "grouping," "identifying," "initiating," "interacting," "modifying," "monitoring," "moving," "outputting," "performing," "placing," "presenting," "processing," "programming," "querying," "removing," "repeating," "sampling," "sorting," "storing," "subtracting," "tracking," "transforming," "using," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Invention

FIG. 1 shows exemplary computer system platform 100 upon which embodiments of the present invention may be implemented. As shown in FIG. 1, portions of the present invention are comprised of computer-readable and computer-executable instructions that reside, for example, in computer system platform 100 and which may be used as a part of a general purpose computer network (not shown). It is appreciated that computer system platform 100 of FIG. 1 is merely exemplary. As such, the present invention can operate within a number of different systems including, but not limited to, general-purpose computer systems, embedded computer systems, laptop computer systems, hand-held computer systems, portable computer systems, stand-alone computer systems, or game consoles.

In one embodiment, depicted by dashed lines 130, computer system platform 100 may comprise at least one processor 110 and at least one memory 120. Processor 110 may comprise a central processing unit (CPU) or other type of processor. Depending on the configuration and/or type of computer system environment, memory 120 may comprise volatile memory (e.g., RAM), non-volatile memory (e.g., ROM, flash memory, etc.), or some combination of the two. Additionally, memory 120 may be removable, non-removable, etc.

In other embodiments, computer system platform 100 may comprise additional storage (e.g., removable storage 140, non-removable storage 145, etc.). Removable storage 140 and/or non-removable storage 145 may comprise volatile memory, non-volatile memory, or any combination thereof. Additionally, removable storage 140 and/or non-removable storage 145 may comprise CD-ROM, digital versatile disks (DVD) or other optical storage, magnetic cassettes, magnetic tape, magnetic disk storage or other magnetic storage devices, or any other medium which can be used to store information for access by computer system platform 100.

As shown in FIG. 1, computer system platform 100 may communicate with other systems, components, or devices via communication interface 170. Communication interface 170 may embody computer readable instructions, data structures, program modules or other data in a modulated data signal (e.g., a carrier wave) or other transport mechanism. By way of example, and not limitation, communication interface 170 may couple to wired media (e.g., a wired network, direct-wired connection, etc.) and/or wireless media (e.g., a wireless network, a wireless connection utilizing acoustic, RF, infrared, or other wireless signaling, etc.). Communication interface 170 may also couple computer system platform 100 to one or more input devices (e.g., a keyboard, mouse, pen, voice input device, touch input device, etc.) and/or output devices (e.g., a display, speaker, printer, etc.).

Graphics processor 150 may perform graphics processing operations on graphical data stored in frame buffer 160 or another memory (e.g., 120, 140, 145, etc.) of computer system platform 100. In one embodiment, graphics processor 150 and processor 110 may be combined into a single unit (e.g., thereby forming a general purpose processor). Graphical data stored in frame buffer 160 may be accessed, processed, and/or modified by components (e.g., graphics processor 150, processor 110, etc.) of computer system platform 100 and/or components of other systems/devices. Additionally, the graphical data may be accessed (e.g., by graphics processor 150) and displayed on an output device coupled to computer system platform 100. Accordingly, one or more processors (e.g., processor 130, graphics processor 150, a hybrid processor formed by processor 130 and graphics processor 150, etc.) may access and/or execute instructions stored in a memory accessible to computer system platform 100 (e.g., 120, 140, 145, a memory accessed via communication interface 170, etc.) for performing one or more computer system operations.

As shown in FIG. 1, graphics processor 150 and frame buffer 160 may be communicatively coupled by bi-directional interface 180. It should be appreciated that graphics processor 150 may comprise or implement a memory controller in one embodiment, while frame buffer 160 may comprise or implement a memory component in one embodiment. In this manner, interface 180 may comprise a memory interface. Interface 180 may comprise multiple lanes or paths (e.g., each communicating a bit where bi-directional interface comprises a parallel interface) for communicating information (e.g., using data and/or clock signals) between graphics processor 150 and frame buffer 160. Each path may comprise one or more traces and/or other components for implementing differential signaling, single-ended signaling, or some combination thereof. Additionally, interface 180 may be partitioned into one or more portions or partitions, where at least two partitions are capable of communicating data in opposite directions and implementing a loopback configuration between graphics processor 150 and frame buffer 160 as discussed below.

And in other embodiments, one or more other components of computer system 100 may be communicatively coupled by interface 180. For example, interface 180 may couple processor 110 and graphics processor 150. Alternatively, interface 180 may couple processor 110 and memory 120. Additionally, in other embodiment, interface 180 may implement a chipset interface communicatively coupling a chipset component (e.g., northbridge, southbridge, etc.) to another chipset component and/or a non-chipset component (e.g., processor 110, memory 120, graphics processor 150, frame buffer 160, etc.). As such, although interface 180 is depicted in FIG. 1, and in FIGS. 2A through 3 below, as coupling graphics processor 150 and frame buffer 160, it should be appreciated that interface 180 may couple other components of computer system 100 in other embodiments.

Figure 2A:
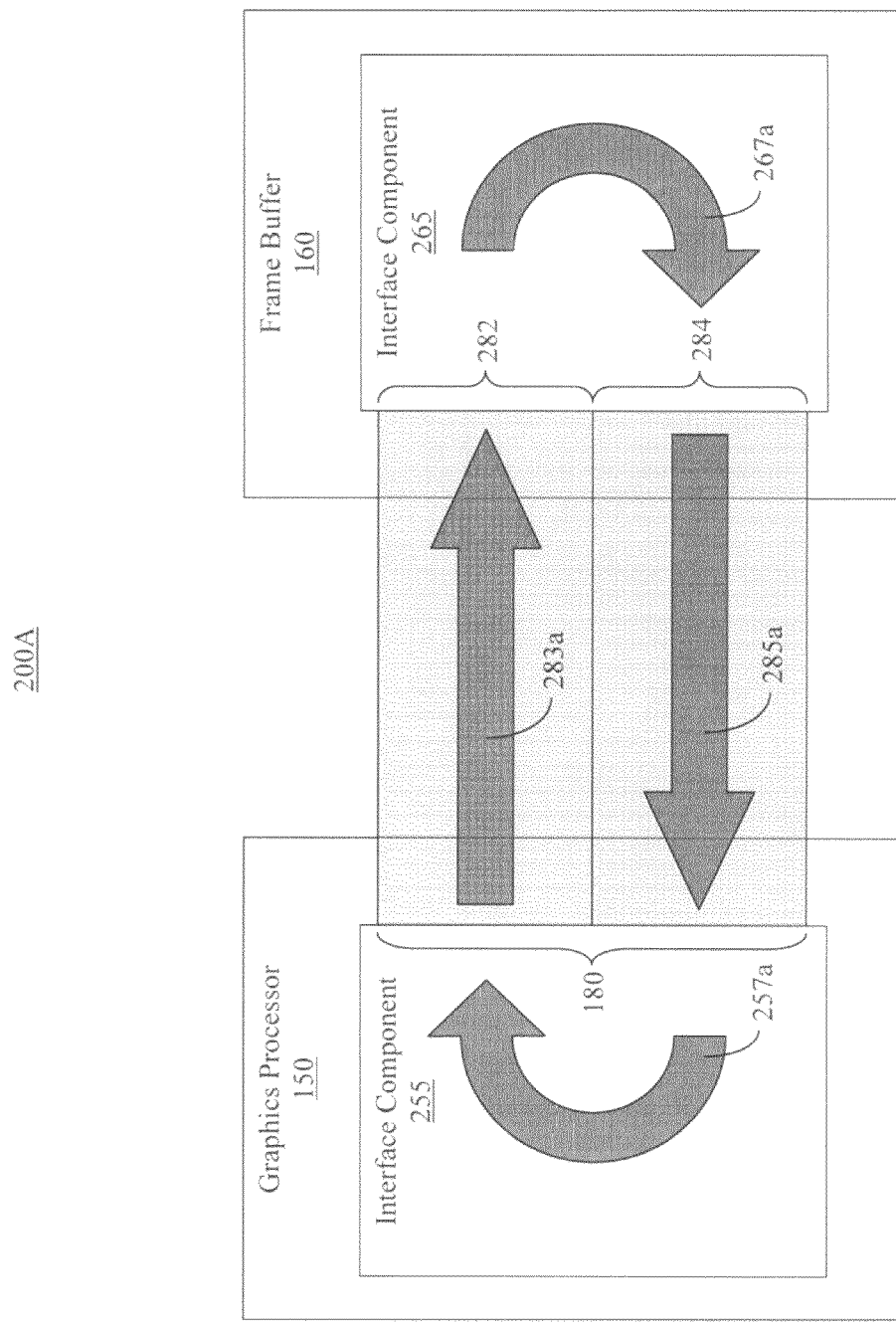
FIG. 2A shows a block diagram of an exemplary partitioning of a bi-directional interface for implementing an exemplary loopback configuration in accordance with one embodiment of the present invention.

FIG. 2A shows block diagram 200A of an exemplary partitioning of bi-directional interface 180 for implementing exemplary loopback configurations in accordance with one embodiment of the present invention. As shown in FIG. 2A, interface 180 comprises bi-directional partition 282 for transmitting data (e.g., performing a write operation) in a first direction (e.g., from graphics processor 150 to frame buffer 160) as indicated by arrow 283a. Interface 180 also comprises bi-directional partition 284 for transmitting data (e.g., performing a read operation) in a second direction (e.g., from frame buffer 160 to graphics processor 150) as indicated by arrow 285a. Partitions 282 and 284 may be bit-equal (e.g., where each partition is allocated an equal number of lanes, paths, bits, etc.) in one embodiment, or alternatively, the partitions (e.g., 282 and 284) may be bit-unequal (e.g., where each partition is allocated a different number of lanes, paths, bits, etc.) in another embodiment. Additionally, it should be appreciated that information may be communicated over partitions 282 and 284 simultaneously in one embodiment, or alternatively, information may be communicated over the partitions (e.g., 282 and 284) non-simultaneously or sequentially in another embodiment.

As shown in FIG. 2A, frame buffer 160 comprises interface component 265 for implementing a loopback configuration (e.g., depicted by arrows 283a, 267a and 285a) of interface 180 by looping or coupling partitions 282 and 284. For example, interface component 265 may receive signals (e.g., generated by components of graphics processor 150) transmitted over partition 282 and communicate signals over partition 284 in response thereto. The signals communicated over partition 284 by interface component 265 may be generated (e.g., by interface component 265, by another component of frame buffer 160, by a component of computer system 100, etc.) based upon signals received over partition 282, may comprise relayed or conveyed versions of signals communicated over partition 282, or some combination thereof.

Graphics processor 150 comprises interface component 255 for implementing a loopback configuration (e.g., depicted by arrows 285a, 257a and 283a) of interface 180 by looping or coupling partitions 282 and 284. For example, interface component 255 may receive signals (e.g., generated by components of frame buffer 160) transmitted over partition 284 and communicate signals over partition 282 in response thereto. The signals communicated over partition 282 by interface component 255 may be generated (e.g., by interface component 255, by another component of graphics processor 150, by a component of computer system 100, etc.) based upon signals received over partition 284, may comprise relayed or conveyed versions of signals communicated over partition 284, or some combination thereof.

Accordingly, interface 180 may be used to perform data link training (e.g., to calibrate for data link latency, latency attributable to interface components, etc.) when placed in a loopback configuration (e.g., using interface component 255, interface component 265, etc.). For example, training data may be communicated from graphics processor 150 over partition 282 and used to adjust the delay of a frame buffer clock such that subsequently-transferred data may be clocked out from partition 282 by interface component 265. Partition 284 may be used to transmit the received training data (e.g., in encoded or non-encoded form) and/or information related to the training (e.g., a training status indicator indicating whether or not the training is complete, a data bus inversion (DBI) bit to indicate whether the data transmitted over partition 284 is inverted or not, a CRC of the received data, etc.) back to graphics processor 150. Similar data link training may be performed by frame buffer 160 using the partitions (e.g., 282 and 284) and interface component 255. The loopback configuration of interface 180 used for data link training may be transitioned into from a normal or mission operating mode (e.g., where partitions 282 and 284 communicate signals in the same direction).

As such, a single bi-directional interface (e.g., interface 180) may be used to calibrate the interface itself and/or components coupled to the interface (e.g., portions of interface component 265, other components used to communicate data over interface 180, etc.). Although such data link training may be used before normal operation (e.g., mission mode operation) for initial calibration, it should be appreciated that similar data link training may be performed using interface 180 during or in between normal operations (e.g., reads/writes to frame buffer memory 160, etc.) to compensate for variations which may occur over time. Such variations occurring over time may comprise process-voltage-temperature, or PVT, variations. Alternatively, the variations may comprise process variations, voltage variations, temperature variations, or some combination thereof, in other embodiments.

Interface 180 may also be used to perform automated testing of components and/or circuitry of computer system 100 (e.g., coupled to interface 180). For example, test data (e.g., test patterns, test vectors, etc.) may be communicated from graphics processor 150 over partition 282 to interface component 265. The test data may be communicated to the component/circuitry being tested before being communicated back to graphics processor 150 over partition 284 for comparison with expected values to validate operation of components (e.g., portions of a memory core within frame buffer 160, input/output components used to access or communicate data over interface 180 or through components coupled to interface 180, etc.) and/or circuitry coupled to interface 180. The loopback configuration of interface 180 used for automated testing may be transitioned into from a normal or mission operating mode (e.g., where partitions 282 and 284 communicate signals in the same direction). Similar automated testing of graphics processor 150 and/or components thereof may be performed using the partitions (e.g., 282 and 284) and interface component 255. As such, a single bi-directional interface (e.g., interface 180) may be used to automatically test components and/or circuitry coupled to the interface (e.g., 180).

Figure 2B:
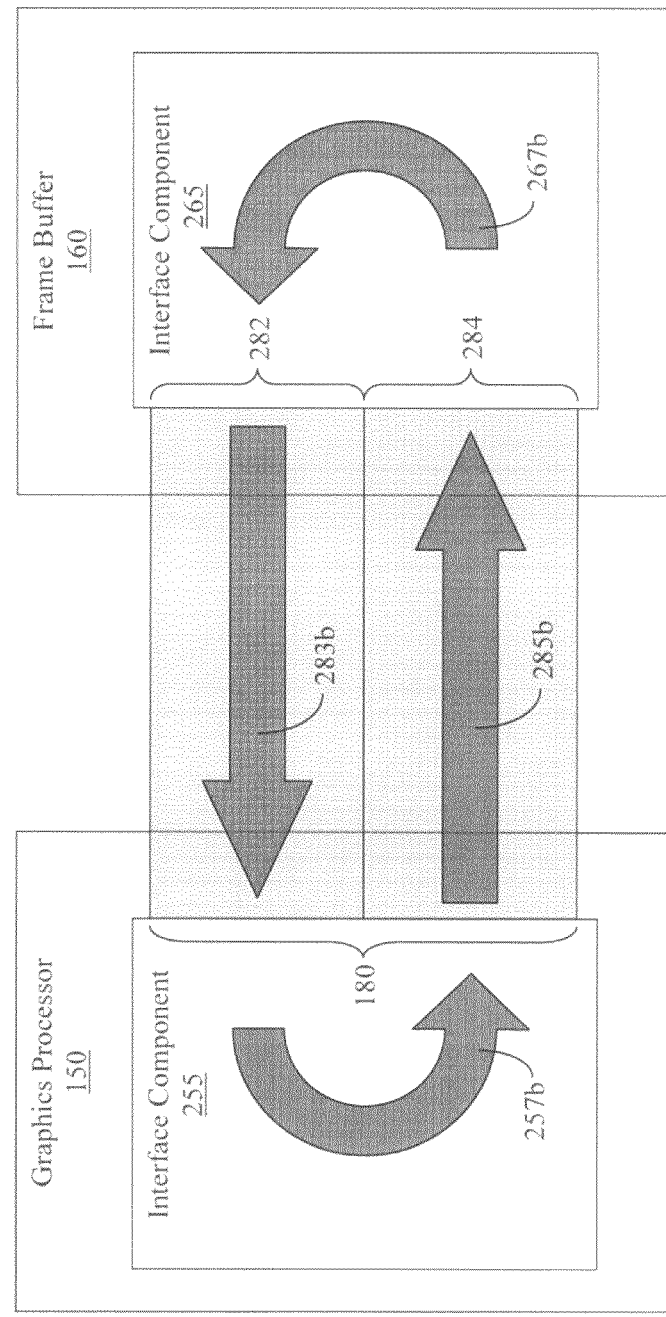
FIG. 2B shows a block diagram of an exemplary partitioning of a bi-directional interface for implementing an exemplary loopback configuration in a reverse direction in accordance with one embodiment of the present invention.

FIG. 2B shows block diagram 200B of an exemplary partitioning of bi-directional interface 180 for implementing exemplary loopback configurations in a reverse direction in accordance with one embodiment of the present invention. As shown in FIG. 2B contrasted with FIG. 2A, the direction of data communication over partitions 282 and 284 can be reversed (e.g., as shown by arrows 283b and 285b of FIG. 2B which point in the opposite direction of arrows 283a and 285a, respectively, of FIG. 2A). In this manner, interface component 265 may implement a first loopback configuration (e.g., depicted by arrows 285b, 267b and 283b) of interface 180, whereas interface component 255 may implement a second loopback configuration (e.g., depicted by arrows 283b, 257b and 285b) of interface 180. It should be appreciated that the loopback configurations of interface 180 implemented by interface components 255 and 265 as depicted in FIG. 2B may be used for calibration (e.g., data link training, etc.) and/or automated testing (e.g., of components coupled to interface 180) as described above with respect to FIG. 2A.

Accordingly, embodiments provide swappable loopback configurations which may be swapped by switching the active interface component between interface component 255 and interface component 265 to swap the looped or coupled end between graphics processor 150 and frame buffer 160 as depicted in FIGS. 2A and 2B. Additionally, embodiments provide reversible loopback configurations which may be reversed by switching the direction in which data is communicated over partitions 282 and 284 as depicted in FIGS. 2A and 2B. Thus, embodiments of the present invention enable different and/or additional calibration operations and/or tests to be performed when compared with conventional loopback configurations.

Although FIGS. 2A and 2B depict only two partitions (e.g., 282 and 284), it should be appreciated that interface 180 may comprise a larger number of partitions in other embodiments. Additionally, it should be appreciated that interface 180 may comprise at least one portion that is not used in a loopback configuration in other embodiments, where the unused portion or portions may be arranged in any fashion (e.g., between, beside, etc.) with respect to the portions used for the loopback configuration. It should also be appreciated that graphics processor 150 or frame buffer 160 may be implemented without an interface component (e.g., 255 and 265, respectively) for implementing the loopback configuration in other embodiments. Further, it should be appreciated that the loopback configuration depicted in FIGS. 2A and 2B may be implemented using any bi-directional interface coupling any two computer system components (e.g., of computer system 100 of FIG. 1, etc.) in other embodiments.

FIG. 2C shows block diagram 200C of an exemplary partitioning of a bi-directional interface in an interlaced manner for implementing an exemplary loopback configuration in accordance with one embodiment of the present invention. As shown in FIG. 2C, interface 180 comprises multiple bits or paths 287*a*-287*n* in an interlaced loopback configuration (e.g., where at least one of the paths is configured in a direction opposite from at least one other path) for communicating data or other signals between graphics processor 150 and frame buffer 160. For example, paths 287*a*-287*n* may alternate (e.g., the direction of every other bit or path is reversed) as shown in FIG. 2C. In other embodiments, paths 287*a*-287*n* may comprise an alternate interlaced configuration (e.g., the direction of every nth bit or path is reversed, the directions of the paths 287*a*-287*n* are randomly configured, etc.). As such, it should be appreciated that one or more of paths 287*a*-287*n* in a first direction (e.g., from graphics processor 160 toward frame buffer 160) may implement a first partition (e.g., 282) of interface 180, while one or more of paths 287*a*-287*n* in a second direction (e.g., from frame buffer 160 toward graphics processor 160) may implement a second partition (e.g., 284) of interface 180.

Accordingly, the interlaced loopback configuration of interface 180 as shown in FIG. 2C may be used to perform data link training (e.g., to calibrate for data link latency, latency attributable to interface components, etc.) in one embodiment. For example, interface 180 may be transitioned from a normal or mission operating mode (e.g., with all of paths 287*a*-287*n* in the same direction) to the interface configuration depicted in FIG. 2C to enable the communication of training data between graphics processor 150 and frame buffer 160. As such, interface 180 may be used to calibrate the interface itself and/or components coupled to the interface (e.g., portions of interface component 265, other components used to communicate data over interface 180, etc.). Although such data link training may be used before normal operation for initial calibration, it should be appreciated that similar data link training may be performed using interface 180 during or in between normal operations (e.g., reads/writes to frame buffer memory 160, etc.) to compensate for variations which may occur over time. Such variations occurring over time may comprise process-voltage-temperature, or PVT, variations. Alternatively, the variations may comprise process variations, voltage variations, temperature variations, or some combination thereof, in other embodiments.

Additionally, the interlaced loopback configuration of interface 180 as shown in FIG. 2C may be used to perform automated testing of components and/or circuitry of computer system 100 (e.g., coupled to interface 180) in one embodiment. For example, interface 180 may be transitioned from a normal or mission operating mode (e.g., with all of paths 287*a*-287*n* in the same direction) to the interface configuration depicted in FIG. 2C to enable the communication of test data (e.g., test patterns, test vectors, etc.) between graphics processor 150 and frame buffer 160. The test data may be communicated to the component/circuitry being tested before being communicated back to graphics processor 150 for comparison with expected values to validate operation of components (e.g., portions of a memory core within frame buffer 160, input/output components used to access or communicate data over interface 180 or through components coupled to interface 180, etc.) and/or circuitry coupled to interface 180. Similar automated testing of graphics processor 150 and/or components thereof may be also be performed using the interfaced loopback configuration of interface 180. As such, interface 180 may be used to automatically test components and/or circuitry coupled to the interface (e.g., 180).

Figure 3:
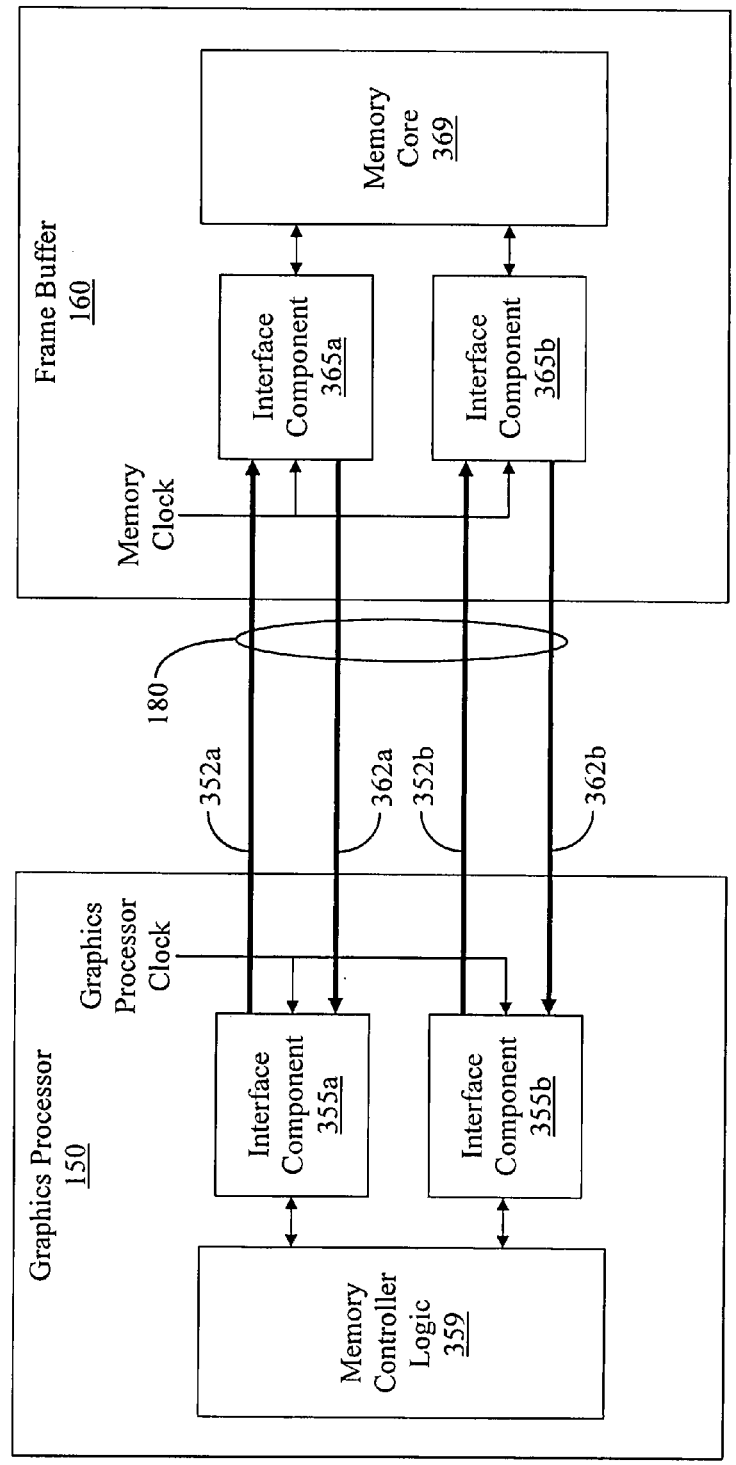
FIG. 3 shows a block diagram of an exemplary partitioning using more than two partitions of a bi-directional interface for implementing an exemplary loopback configuration in accordance with one embodiment of the present invention.

FIG. 3 shows block diagram 300 of an exemplary partitioning using more than two partitions of bi-directional interface 180 for implementing an exemplary loopback configuration in accordance with one embodiment of the present invention. As shown in FIG. 3, interface 180 is partitioned into four partitions (e.g., 352*a*, 362*a*, 352*b* and 362*b*), where each partition comprises one or more paths/lanes. In one embodiment, partitions 352*a* and 362*a* may communicate even bits, while partitions 352*b* and 362*b* may communicate odd bits. Partitions 352*a* and 362*a* communicate information between interface component 355*a* of graphics processor 150 and interface component 365*a* of frame buffer 160. Partitions 352*b* and 362*b* communicate information between interface component 355*b* of graphics processor 150 and interface component 365*b* of frame buffer 160. Additionally, interface components 355*a* and 355*b* are clocked by a local graphics processor clock and coupled to memory controller logic 359, while interface components 365*a* and 365*b* are clocked by a local memory clock and coupled to memory core 369.

Interface components 355*a* and 365*a* are operable to couple or loop partitions 352*a* and 362*a* (e.g., as discussed above with respect to interface components 255 and 265 of FIGS. 2A and 2B), and therefore, implement loopback configurations (e.g., using interface component 355*a*, using interface component 365*a*, etc.) between graphics processor 150 and frame buffer 160. Similarly, interface components 355*b* and 365*b* are operable to couple or loop partitions 352*b* and 362*b* (e.g., as discussed above with respect to interface components 255 and 265 of FIGS. 2A and 2B), and therefore, implement loopback configurations (e.g., using interface component 355*b*, using interface component 365*b*, etc.) between graphics processor 150 and frame buffer 160. Interface components 355*a*-365*b* may be selectively activated and implement swappable loopback configurations (e.g., as discussed above with respect to FIGS. 2A and 2B) in one embodiment. Additionally, it should be appreciated that the direction of information communication over partitions 352*a*-362*b* may be reversed in one embodiment, thereby enabling interface 180 to implement reversible loopback configurations (e.g., as discussed above with respect to FIGS. 2A and 2B) in one embodiment. Accordingly, embodiments of the present invention enable different and/or additional calibration operations and/or tests to be performed when compared with conventional loopback configurations.

Data link training may be performed using two or more of partitions 352*a*-362*b* when the partitions are placed in a loopback configuration (e.g., using interface components 355*a*, 365*a*, 355*b*, 365*b*, or some combination thereof). For example, memory controller logic 359 may communicate training data over partition 352*a* using interface component 355*a*. The training data may be used by interface component 365*a* to adjust the delay of the local memory clock such that subsequently-transferred data may be clocked out from partition 352*a* by interface component 365*a*. Partition 362*a* may be used to transmit the received training data (e.g., in encoded or non-encoded form) and/or information related to the training (e.g., a training status indicator indicating whether or not the training is complete, a data bus inversion (DBI) bit to indicate whether the data transmitted over partition 284 is inverted or not, a CRC of the received data, etc.) back to memory controller logic 359 (e.g., to provide feedback and enable control of the data link training process) via interface component 355*a*. Similar data link training may be performed by memory controller logic 359 using partitions 352b and 362b, or alternatively, data link training may be performed by memory core 369 using any of the partitions (e.g., 352a-362b) and interface components (e.g., 355a and/or 355b). As such, a single bi-directional interface (e.g., interface 180) may be used to calibrate the interface itself and/or components coupled to the interface (e.g., portions of interface components 355a-365b, other components used to communicate data over interface 180, etc.). Although such data link training may be used before normal operation for initial calibration, it should be appreciated that similar data link training may be performed using interface 180 during or in between normal operations (e.g., reads/writes to frame buffer memory 160, etc.) to compensate for variations which may occur over time. Such variations occurring over time may comprise process-voltage-temperature, or PVT, variations. Alternatively, the variations may comprise process variations, voltage variations, temperature variations, or some combination thereof, in other embodiments.

Additionally, automated testing of components and/or circuitry of computer system 100 (e.g., coupled to interface 180) may be performed using two or more of partitions 352a-362b when the partitions are placed in a loopback configuration (e.g., using interface components 355a, 365a, 355b, 365b, or some combination thereof). For example, test data (e.g., test patterns, test vectors, etc.) may be communicated from memory controller logic 359 over partition 352a to interface component 365a. The test data may be communicated to the component/circuitry being tested before being communicated back to memory controller logic 359 over partition 362a for comparison with expected values to validate operation of components (e.g., portions of a memory core 369, input/output components used to access or communicate data over interface 180 or through components coupled to interface 180, etc.) and/or circuitry coupled to interface 180. Similar automated testing may be performed by memory controller logic 359 using partitions 352b and 362b, or alternatively, graphics processor 150 and/or components thereof (e.g., memory controller logic 359, etc.) may be tested using any of the partitions (e.g., 352a-362b) and interface components (e.g., 355a and 355b). As such, a single bi-directional interface (e.g., interface 180) may be used to automatically test components and/or circuitry coupled to the interface (e.g., 180).

Although FIG. 3 depicts four partitions, it should be appreciated that a larger or smaller number of partitions can be used in other embodiments. Additionally, it should be appreciated that a larger or smaller number of interface components (e.g., 355a-365b) may be used in other embodiments. Further, it should be appreciated that multiple interface components (e.g., 355a and 355b, 365a and 365b, etc.) may be combined into a single interface component in other embodiments. Additionally, although interface components 355a-365b are shown as clocked interface components in FIG. 3, it should be appreciated that one or more of the interface components (e.g., 355a and 355b, 365a and 365b, etc.) may not be clocked in other embodiments.

Figure 4A:
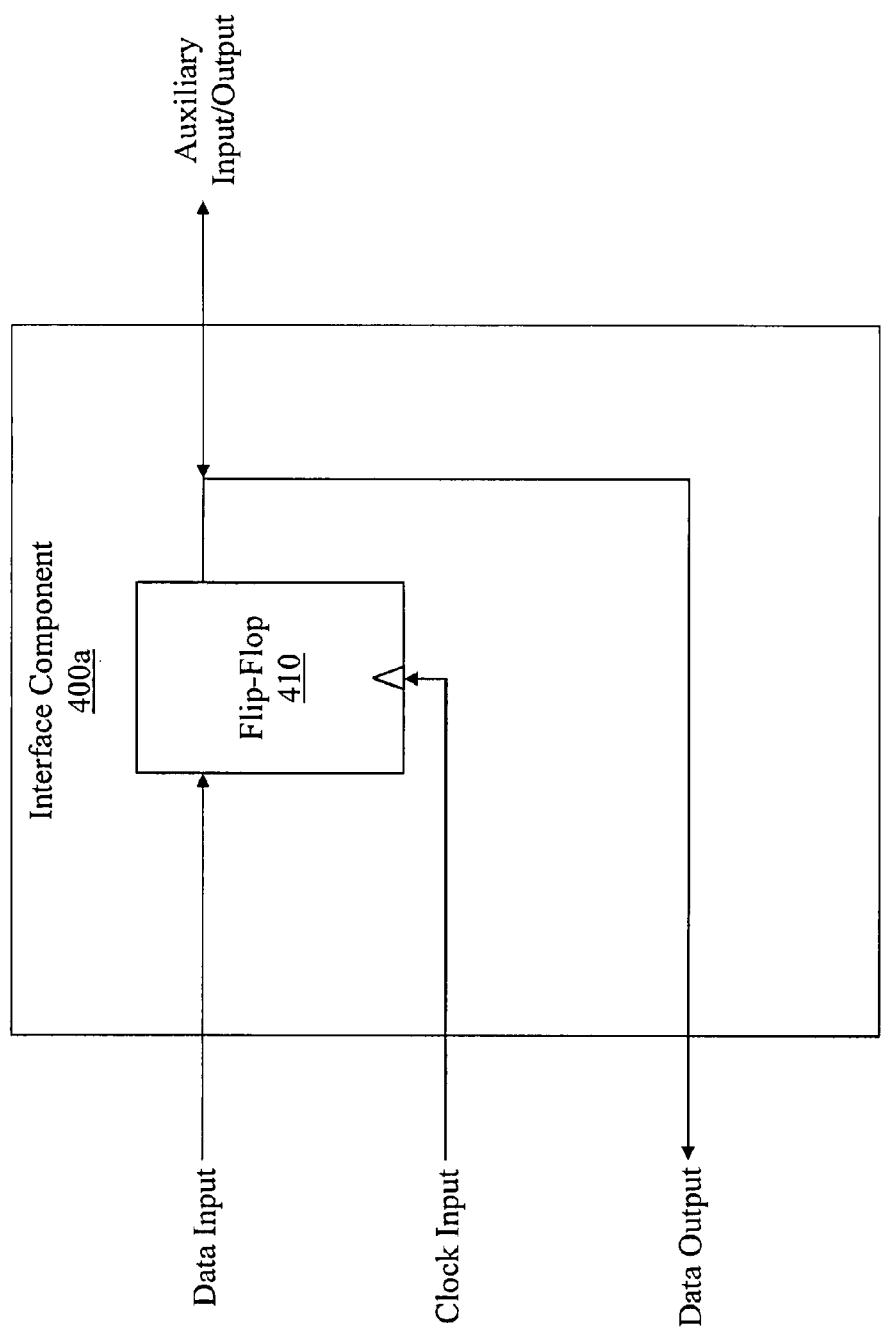
FIG. 4A shows an exemplary interface component comprising a flip-flop in accordance with one embodiment of the present invention.

FIG. 4A shows exemplary interface component 400a comprising flip-flop 410 in accordance with one embodiment of the present invention. Interface component 400a may be used to implement interface component 255, 265, 355a, 355b, 365a, 365b, or some combination thereof.

As shown in FIG. 4A, flip-flop 410 is clocked by a clock input (e.g., a local memory clock) and receives data (e.g., communicated over partition 282, 284, 352a, 362a, 352b, 362b, or some combination thereof). The output of flip-flop 410 is output from interface component 400a as an auxiliary output (e.g., to memory core 369, to memory controller logic 359, etc.) and/or as a data output (e.g., communicated over partition 282, 284, 352a, 362a, 352b, 362b, or some combination thereof). Where the output from flip-flop 410 comprises an auxiliary output, interface component 400a may receive an auxiliary input (e.g., from the same component to which the auxiliary output is communicated) which may then be output from interface component 400a as a data output (e.g., communicated over partition 282, 284, 352a, 362a, 352b, 362b, or some combination thereof). For example, the auxiliary input and/or output may comprise data used for data link training (e.g., communicated to and/or from components for performing the clock delay and/or other operations used for data link training), data used for component/circuitry testing (e.g., communicated to and/or from the component being tested).

Figure 4B:
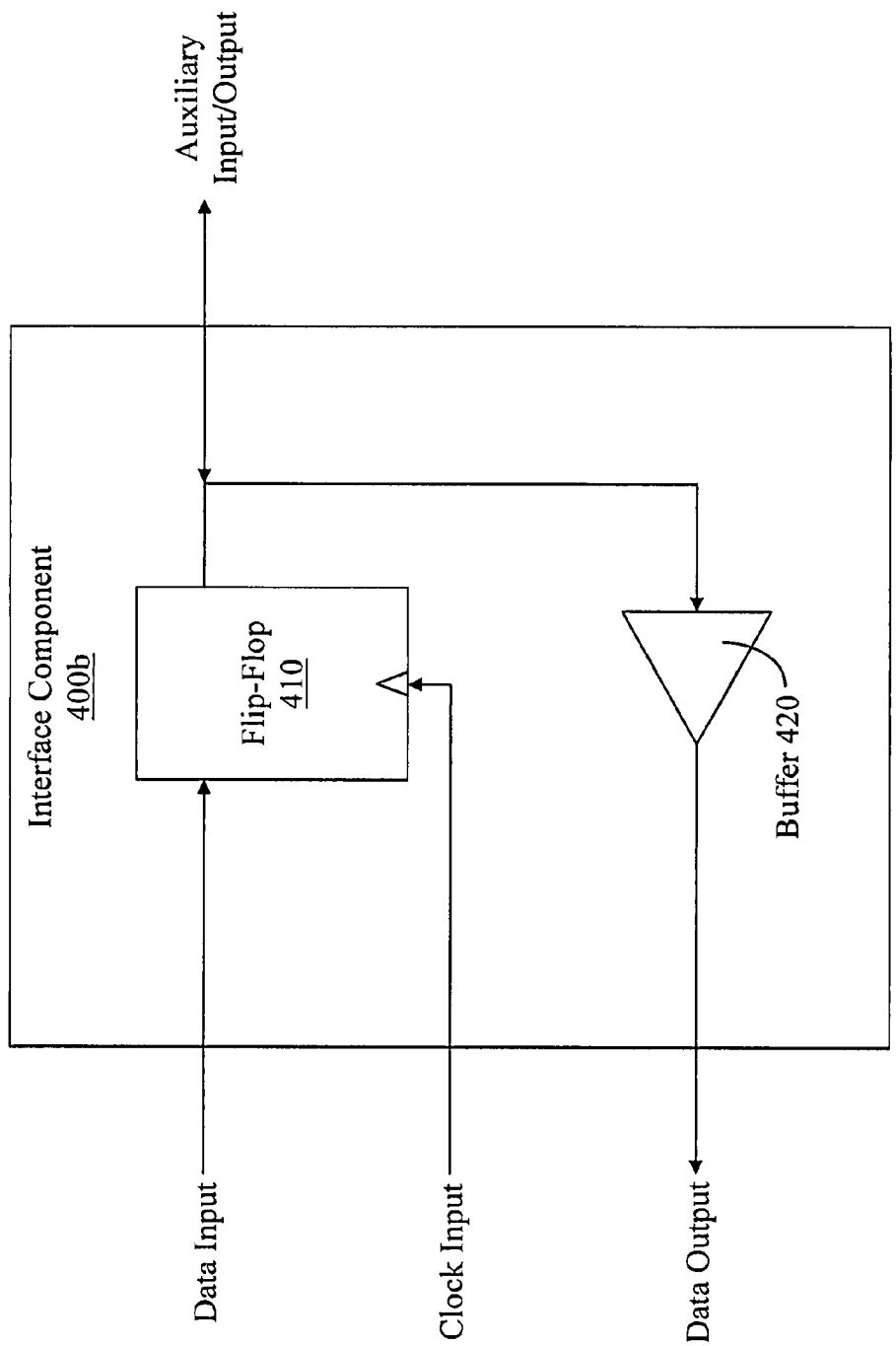
FIG. 4B shows an exemplary interface component comprising a flip-flop and a buffer in accordance with one embodiment of the present invention.

FIG. 4B shows an exemplary interface component 400b comprising flip-flop 410 and buffer 420 in accordance with one embodiment of the present invention. Interface component 400b may operate similarly to interface component 400a of FIG. 4A, except that data may be buffered by buffer 420 before being output from interface component 400b.

Figure 4C:
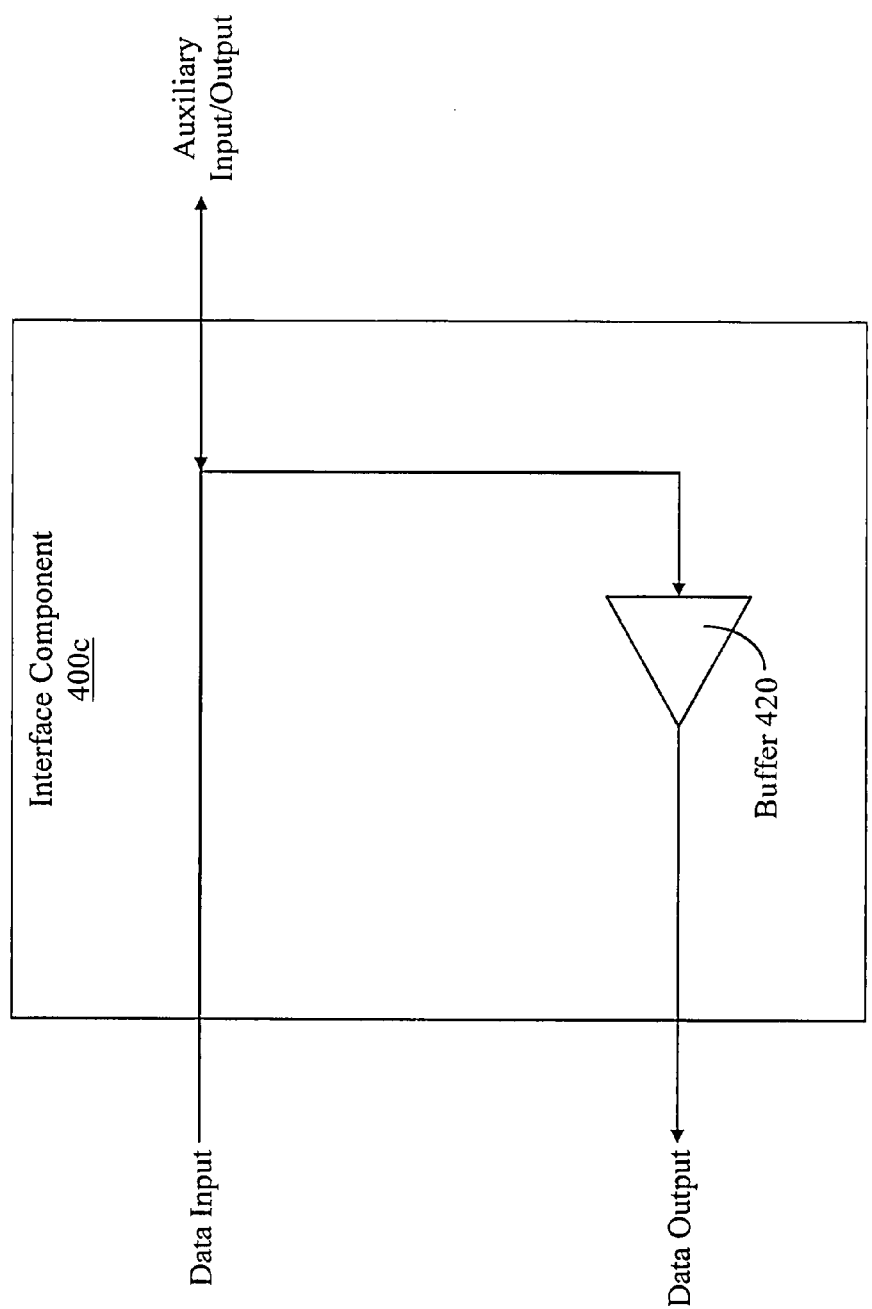
FIG. 4C shows an exemplary interface component comprising a buffer in accordance with one embodiment of the present invention.

FIG. 4C shows exemplary interface component 400c comprising buffer 420 in accordance with one embodiment of the present invention. Interface component 400c may operate similarly to interface component 400b of FIG. 4B, except that data input to interface component 400c is not passed through a clocked flip-flop (e.g., 410) and instead communicated to buffer 420 and/or from interface component 400c as an auxiliary output.

Although FIGS. 4A-4C depict specific components (e.g., flip-flop 410 and/or buffer 420) for accessing the data signals, it should be appreciated that the interface components may comprise different components (e.g., logic components/circuitry, other components/circuitry, etc.) and/or different combinations of components in other embodiments. Additionally, it should be appreciated that flip-flop 410 and/or buffer 420 may be part of a larger logic block in other embodiments.

Figure 5:
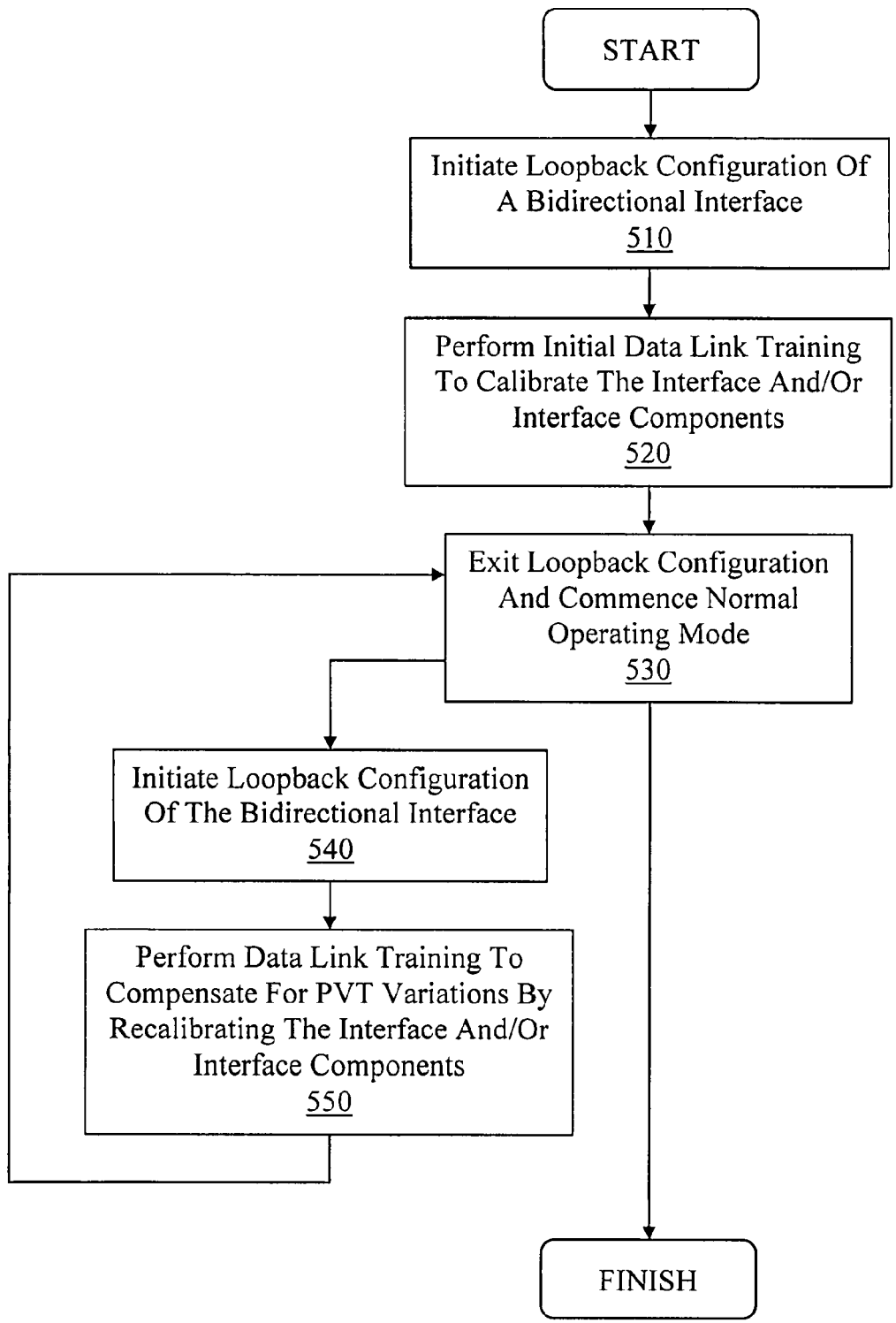
FIG. 5 shows an exemplary process of performing data link training using a loopback configuration of a bi-directional interface in accordance with one embodiment of the present invention.

FIG. 5 shows exemplary process 500 of performing data link training using a loopback configuration of a bi-directional interface in accordance with one embodiment of the present invention. As shown in FIG. 5, step 510 involves initiating a loopback configuration of a bi-directional interface (e.g., 180). As such, a first partition (e.g., 282) may be identified for communicating information in a first direction and a second partition (e.g., 284) may be identified for communicating information in a second direction. The first and second partitions may couple a first and second component (e.g., graphics processor 150 and frame buffer 160), where each component may comprise a respective interface component (e.g., 255 and 265) for implementing the loopback configuration (e.g., by looping or coupling the partitions). The first and second directions may comprise opposite directions in one embodiment. Additionally, the directions of information communication over each partition may be reversible in one embodiment, thereby enabling the interface (e.g., 180) to implement reverse loopback configurations. And further, the bits or paths of interface 180 (e.g., 287a-287n) may be transitioned into an interlaced loopback configuration (e.g., as discussed with respect to FIG. 2C) in step 510 in one embodiment.

Step 520 involves performing initial data link training to calibrate the interface (e.g., 180 or portions thereof) and/or interface components (e.g., any component coupled to interface 180, interface components 255/265, etc.). The data link training may comprise communicating training data from the first component (e.g., graphics processor 150) over the first partition (e.g., 282) and used to adjust the delay of a frame buffer clock such that subsequently-transferred data may be clocked out from the first partition (e.g., 282) by an interface component (e.g., 265) of the second component (e.g., frame buffer 160). The second partition (e.g., 284) may be used to transmit the received training data (e.g., in encoded or non-encoded form) and/or information related to the training (e.g., a training status indicator indicating whether or not the training is complete, a data bus inversion (DBI) bit to indicate whether the data transmitted over partition 284 is inverted or not, a CRC of the received data, etc.) back to the first component (e.g., graphics processor 150). Similar data link training may be performed by the second component (e.g., frame buffer 160) using the partitions (e.g., 282 and 284) and an interface component (e.g., 255) of the first component (e.g., graphics processor 150).

As shown in FIG. 5, step 530 involves exiting the loopback configuration and commencing a normal operating mode. Where the bi-directional interface (e.g., 180) comprises a memory interface, the normal operating mode may comprise accessing a memory (e.g., frame buffer 160) coupled to the interface (e.g., 180).

Thereafter, process 500 may commence, or alternatively, step 540 may be performed. Step 540 involves initiating a loopback configuration of a bi-directional interface (e.g., 180). Step 540 may be performed analogously to step 510 in one embodiment.

As shown in FIG. 5, step 550 involves performing data link training to compensate for PVT variations by recalibrating the interface and/or interface components. Step 550 may be performed similarly to step 520 in one embodiment. Thereafter, step 530 may be repeated.

Figure 6:
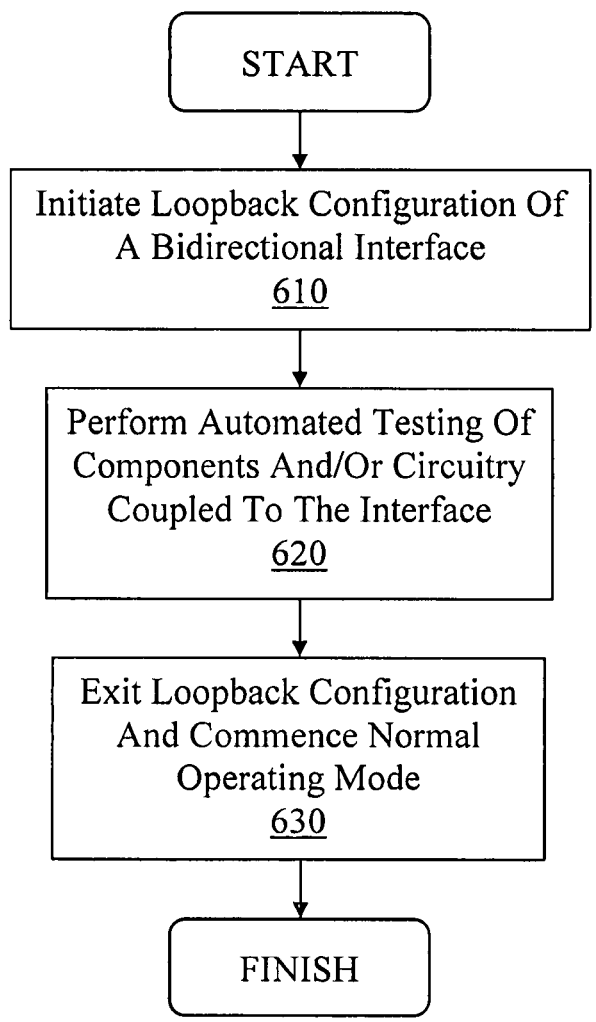
FIG. 6 shows an exemplary process of performing automated testing using a loopback configuration of a bi-directional interface in accordance with one embodiment of the present invention.

FIG. 6 shows exemplary process 600 of performing automated testing using a loopback configuration of a bi-directional interface in accordance with one embodiment of the present invention. As shown in FIG. 6, step 610 involves initiating a loopback configuration of a bi-directional interface (e.g., 180). As such, a first partition (e.g., 282) may be identified for communicating information in a first direction and a second partition (e.g., 284) may be identified for communicating information in a second direction. The first and second partitions may couple a first and second component (e.g., graphics processor 150 and frame buffer 160), where each component may comprise a respective interface component (e.g., 255 and 265) for implementing the loopback configuration (e.g., by looping or coupling the partitions). The first and second directions may comprise opposite directions in one embodiment. Additionally, the directions of information communication over each partition may be reversible in one embodiment, thereby enabling the interface (e.g., 180) to implement reverse loopback configurations. And further, the bits or paths of interface 180 (e.g., 287a-287n) may be transitioned into an interlaced loopback configuration (e.g., as discussed with respect to FIG. 2C) in step 610 in one embodiment.

Step 620 involves performing automated testing of components and/or circuitry coupled to the interface (e.g., 180). The automated testing may comprise communicating test data (e.g., test patterns, test vectors, etc.) from the first component (e.g., graphics processor 150) over the first partition (e.g., 282) to an interface component (e.g., 265) of the second component (e.g., frame buffer 160). The test data may be communicated to the component/circuitry being tested before being communicated back to the first component (e.g., graphics processor 150) over the second partition (e.g., 284) for comparison with expected values to validate operation of components (e.g., portions of a memory core within frame buffer 160, input/output components used to access or communicate data over interface 180 or through components coupled to interface 180, etc.) and/or circuitry coupled to the interface (e.g., 180). Similar automated testing of the first component (e.g., graphics processor 150) and/or components thereof may be performed using the partitions (e.g., 282 and 284) and the interface component (e.g., 255) of the first component (e.g., graphics processor 150).

As shown in FIG. 6, step 630 involves exiting the loopback configuration and commencing a normal operating mode. Where the bi-directional interface (e.g., 180) comprises a memory interface, the normal operating mode may comprise accessing a memory (e.g., frame buffer 160) coupled to the interface (e.g., 180).

Figure 7:
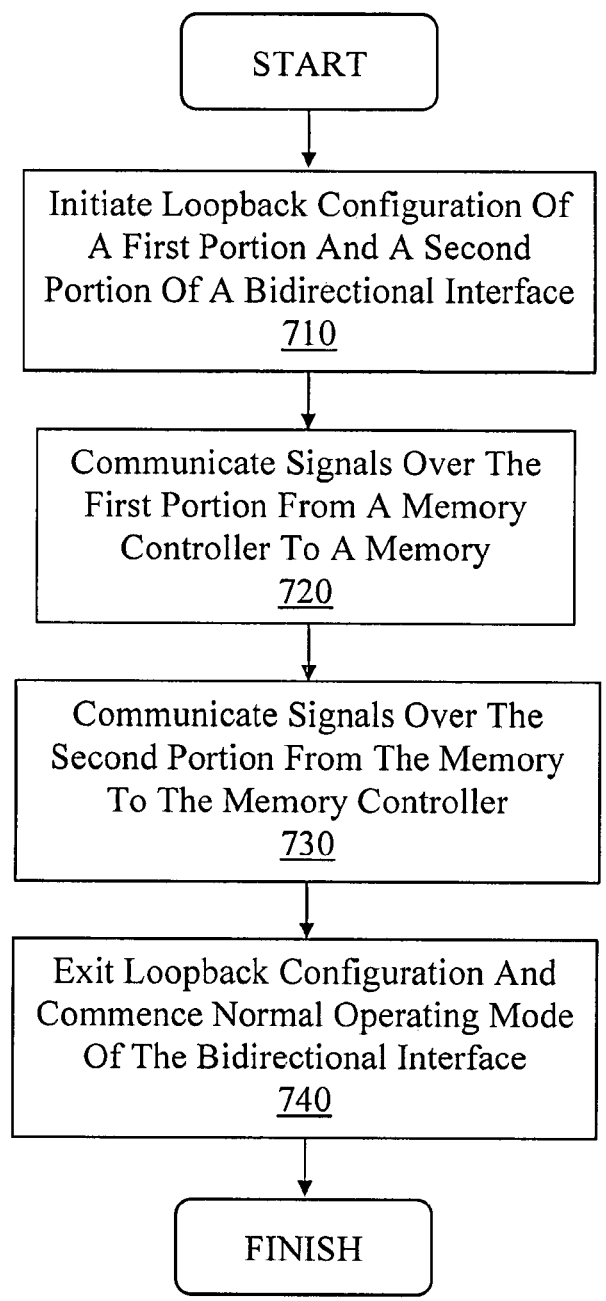
FIG. 7 shows an exemplary process of configuring a bi-directional interface in accordance with one embodiment of the present invention.

FIG. 7 shows exemplary process 700 of configuring a bi-directional interface in accordance with one embodiment of the present invention. As shown in FIG. 7, step 710 involves initiating a loopback configuration of a first portion and a second portion of a bi-directional interface. The first portion or partition (e.g., 282) may communicate information in a first direction, whereas the second portion or partition (e.g., 284) may communicate information in a second direction. The first and second partitions may couple a first and second component (e.g., graphics processor 150 and frame buffer 160), where each component may comprise a respective interface component (e.g., 255 and 265) for implementing the loopback configuration (e.g., by looping or coupling the partitions). The first and second directions may comprise opposite directions in one embodiment. Additionally, the directions of information communication over each partition may be reversible in one embodiment, thereby enabling the interface (e.g., 180) to implement reverse loopback configurations.

Step 720 involves communicating signals over the first portion (e.g., 282) from a memory controller (e.g., memory controller logic 359) to a memory (e.g., frame buffer 160). The memory controller may be implemented within a graphics processor (e.g., 150) in one embodiment. In one embodiment, the signals communicated in step 720 may comprise calibration signals (e.g., data link training signals) for calibrating portions of the bi-directional interface (e.g., 180), components of the memory (e.g., frame buffer 160), components of the memory controller (e.g., memory controller logic 359), other components coupled to the interface (e.g., 180), etc. Alternatively, the signals communicated in step 720 may comprise test signals (e.g., test vectors, test patterns, etc.) for testing portions of the bi-directional interface (e.g., 180), components of the memory (e.g., frame buffer 160), components of the memory controller (e.g., memory controller logic 359), other components coupled to the interface (e.g., 180), etc.

As shown in FIG. 7, step 730 involves communicating signals over the second portion (e.g., 284) from the memory (e.g., frame buffer 160) to the memory controller (e.g., memory controller logic 359). In one embodiment, the signals communicated in step 720 may comprise calibration signals (e.g., data link training signals) for calibrating portions of the bi-directional interface (e.g., 180), components of the memory (e.g., frame buffer 160), components of the memory controller (e.g., memory controller logic 359), other components coupled to the interface (e.g., 180), etc. Alternatively, the signals communicated in step 730 may comprise test signals (e.g., test vectors, test patterns, etc.) for testing portions of the bi-directional interface (e.g., 180), components of the memory (e.g., frame buffer 160), components of the memory controller (e.g., memory controller logic 359), other components coupled to the interface (e.g., 180), etc.

Step 740 involves exiting the loopback configuration and commencing a normal operating mode. Where the bi-directional interface (e.g., 180) comprises a memory interface, the normal operating mode may comprise accessing a memory (e.g., frame buffer 160) coupled to the interface (e.g., 180).

In the foregoing specification, embodiments of the invention have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A bi-directional communication bus system comprising:
   a first component;
   a second component;
   a first portion configured to communicate signals between said first component and said second component, wherein said first portion is operable to implement a first lane; and
   a second portion configured to communicate signals between said first component and said second component, wherein said second portion is operable to implement a second lane; and
   wherein said first and second portions are operable to implement a plurality of loopback configurations one configuration at a time for communicating signals between said first and second components, wherein a first loopback configuration of said plurality of loopback configurations comprises a contemporaneous communication of signals in a first direction over said first portion and in a second direction over said second portion in a first configuration setting, wherein a second loopback configuration of said plurality of loopback configurations comprises a contemporaneous communication of signals in said second direction over said first portion and in said first direction over said second portion, wherein said second component comprises an interface component operable to couple said first and second portions in a second configuration setting, and wherein said interface component is further operable to couple said first and second portions to an auxiliary interface.

2. The bi-directional communication bus system of claim 1, wherein said first component is a graphics processor, wherein said second component comprises a memory, and wherein said first and second portions comprise a memory interface.

3. The bi-directional communication bus system of claim 1, wherein said first component is a memory controller, wherein said second component comprises a memory, and wherein said first and second portions comprise a memory interface.

4. The bi-directional communication bus system of claim 1, wherein said interface component comprises logic circuit.

5. The bi-directional communication bus system of claim 4, wherein said logic circuit comprises a flip-flop.

6. The bi-directional communication bus system of claim 1, wherein said interface component comprises a buffer.

7. The bi-directional communication bus system of claim 1, wherein said plurality of loopback configurations is operable to enable performance of at least one operation selected from a group consisting of calibration of a bi-directional communication bus, calibration of said first component, calibration of said second component, testing of said first component, and testing of said second component.

8. The bi-directional communication bus system of claim 1, wherein said first and second portions are further operable to implement a mission mode of operation.

9. The bi-directional communication bus system of claim 1, wherein said first portion is further operable to implement a third lane, and wherein said first lane, said second lane, and said third lane are interlaced.

10. A method comprising:
    communicating signals between a first component and a second component over a first portion, wherein said first portion is operable to implement a first lane;
    communicating signals between said first component and said second component over a second portion, wherein said second portion is operable to implement a second lane; and
    implementing a plurality of loopback configurations for communicating signals between said first and second components one configuration at a time, wherein a first loopback configuration of said plurality of loopback configurations comprises a contemporaneous communication of signals in a first direction over said first portion and in a second direction over said second portion in a first configuration setting, wherein a second loopback configuration of said plurality of loopback configurations comprises a contemporaneous communication of signals in said second direction over said first portion and in said first direction over said second portion in a second configuration setting, wherein said second component comprises an interface component operable to couple said first and second portions, and wherein said interface component is further operable to couple said first and second portions to an auxiliary interface.

11. The method of claim 10, wherein said first component is a graphics processor, wherein said second component comprises a memory, and wherein said first and second portions comprise a memory interface.

12. The method of claim 10, wherein said first component is a memory controller, wherein said second component comprises a memory, and wherein said first and second portions comprise a memory interface.

13. The method of claim 10, wherein said interface component comprises logic circuit.

14. The method of claim 13, wherein said logic circuit comprises a flip-flop.

15. The method of claim 10, wherein said interface component comprises a buffer.

16. The method of claim 10, wherein said plurality of loopback configurations is operable to allow performance of at least one operation selected from a group consisting of calibration of a bi-directional communication bus, calibration of said first component, calibration of said second component, testing of said first component, and testing of said second component.

17. The method of claim 10, wherein said first and second portions are further operable to implement a mission mode of operation.

18. The method of claim 10, wherein said first portion is further operable to implement a third lane, and wherein said first lane, said second lane, and said third lane are interlaced.

* * * * *